United States Patent [19]
Wilmot et al.

[11] Patent Number: 5,852,381
[45] Date of Patent: Dec. 22, 1998

[54] TURBINE ENGINE IGNITION EXCITER CIRCUIT INCLUDING LOW VOLTAGE LOCKOUT CONTROL

[75] Inventors: Theodore Steven Wilmot, Greenville, S.C.; John Cuervo Driscoll, Raleigh, N.C.; Steven John Kempinski, Seneca; James R. Berliner, Easley, both of S.C.

[73] Assignee: Cooper Industries, Inc., Houston, Tex.

[21] Appl. No.: 831,518

[22] Filed: Apr. 1, 1997

Related U.S. Application Data

[60] Division of Ser. No. 598,904, Feb. 9, 1996, Pat. No. 5,656,966, which is a continuation-in-part of Ser. No. 207,717, Mar. 9, 1994, Pat. No. 5,592,118.

[51] Int. Cl.⁶ .............................. H03K 17/72; F02B 3/08
[52] U.S. Cl. ...................... 327/440; 327/438; 315/209 T
[58] Field of Search .................... 327/427, 434, 327/435, 438, 440, 538, 545, 77; 315/209 R, 209 T

[56] References Cited

U.S. PATENT DOCUMENTS

| | | | |
|---|---|---|---|
| 3,569,727 | 3/1971 | Aggarwal et al. | 307/106 |
| 3,651,341 | 3/1972 | Shano | 327/300 |
| 3,739,235 | 6/1973 | Kessler, Jr. | 317/234 |
| 3,978,513 | 8/1976 | Terasawa | 357/38 |
| 4,177,479 | 12/1979 | DeBruyne et al. | 357/38 |
| 4,536,783 | 8/1985 | Miller et al. | 357/38 |
| 4,833,369 | 5/1989 | White | 315/209 T |
| 4,983,886 | 1/1991 | Balland | 315/209 CD |
| 5,032,969 | 7/1991 | Eggers et al. | 363/21 |
| 5,053,913 | 10/1991 | Lozito et al. | 361/257 |
| 5,065,073 | 11/1991 | Frus | 315/209 R |
| 5,084,800 | 1/1992 | Hijikata | 361/257 |
| 5,092,424 | 3/1992 | Schreiber et al. | 181/145 |
| 5,148,084 | 9/1992 | Frus | 315/76 |
| 5,245,252 | 9/1993 | Frus et al. | 315/209 R |
| 5,399,942 | 3/1995 | Frus | 315/209 R |
| 5,416,689 | 5/1995 | Silverstein et al. | 363/56 |

FOREIGN PATENT DOCUMENTS

| | | | |
|---|---|---|---|
| 046 578 | 3/1982 | European Pat. Off. | H01L 29/743 |
| 369 236 | 5/1990 | European Pat. Off. | F02P 3/08 |
| 481 609 | 4/1992 | European Pat. Off. | F02P 15/00 |
| 672828 | 9/1995 | European Pat. Off. | F02P 17/00 |
| 31 20 254 | 5/1982 | Germany | H01L 29/74 |
| 37 31 412 | 5/1988 | Germany | H03K 17/78 |
| WO90/15242 | 12/1990 | WIPO | F02P 3/08 |
| WO95/24554 | 9/1995 | WIPO | F02P 15/00 |

OTHER PUBLICATIONS

European Standard Search Report re EP 97 30 0836 Date of completion of search: 7 Jul. 1998.
International Search Report—Date of Mailing: 24 Aug. 1995.
R. Müller, "Bauelemente der Halbleiter–Elektronik" (1987) pp. 220–221.
International Rectifier Data Sheet, p. E–119.

*Primary Examiner*—Toan Tran
*Attorney, Agent, or Firm*—Burns, Doane, Swecker & Mathis, L.L.P.

[57] ABSTRACT

An improved turbine engine ignition exciter circuit. Energy stored in an exciter tank capacitor is subsequently switched to the load (igniter plug) through a novel thyristor switching device specifically designed for pulse power applications. The switching device is designed and constructed to include, for example, a highly interdigitated cathode/gate structure. The semiconductor switching device is periodically activated by a trigger circuit which may be comprised of either electromagnetic or optoelectronic triggering circuitry to initiate discharge of energy stored in exciter tank capacitor to mating ignition lead and igniter plug. Likewise, the present invention allows new flexibility in the output PFN (Pulse Forming Network) stage, eliminating need for specialized protective output devices such as saturable output inductors. Due to considerably higher di/dt performance of the device, true high voltage output pulse networks may be utilized without damage to the semiconductor switching device. An exemplary embodiment of invention contains a novel feedback network which causes thyristor timing (trigger) and DC-DC converter circuits to compensate for varying igniter plug wear and dynamic engine combustor conditions, tailoring exciter spark rate, output voltage and energy to account for dynamic load conditions.

21 Claims, 32 Drawing Sheets

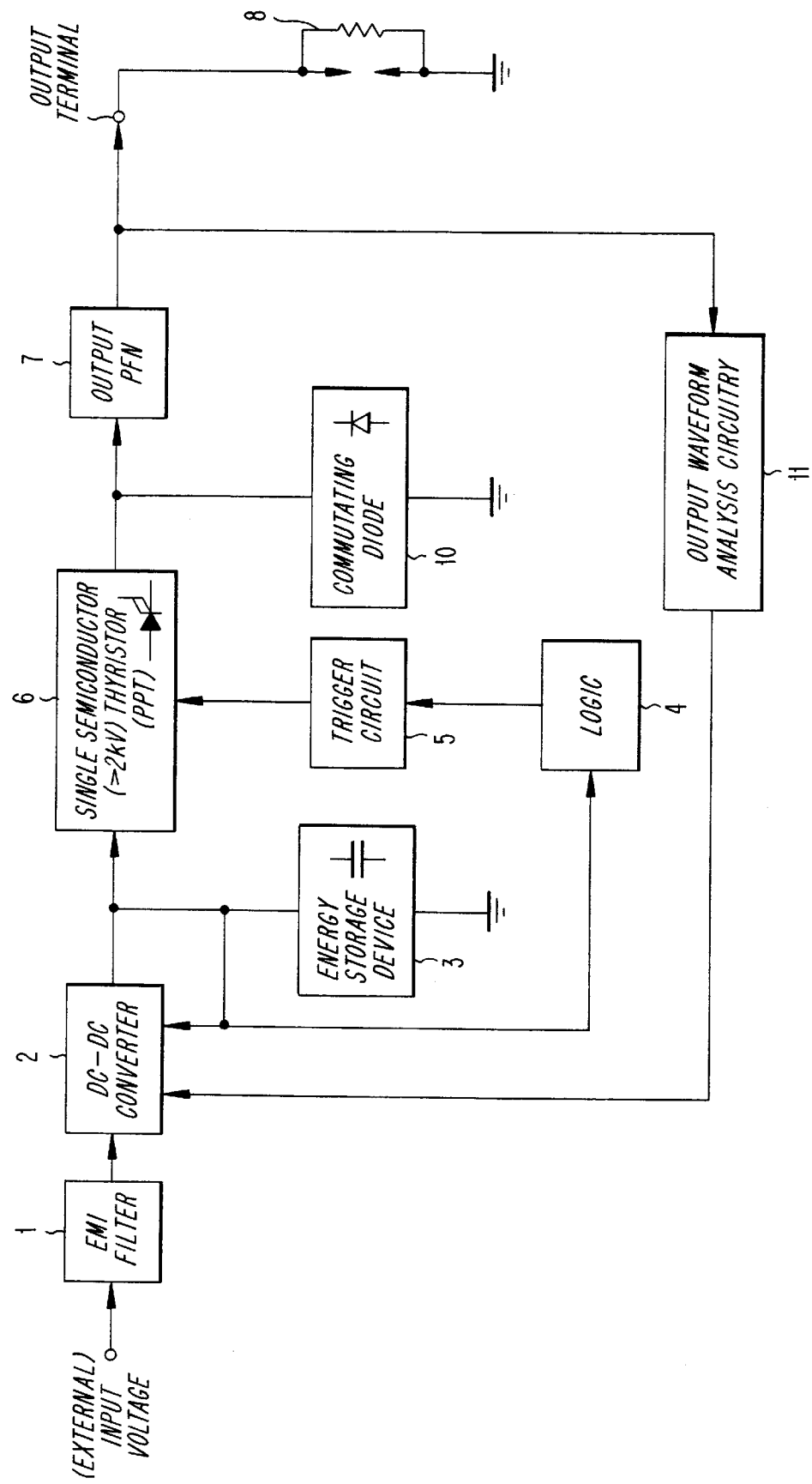

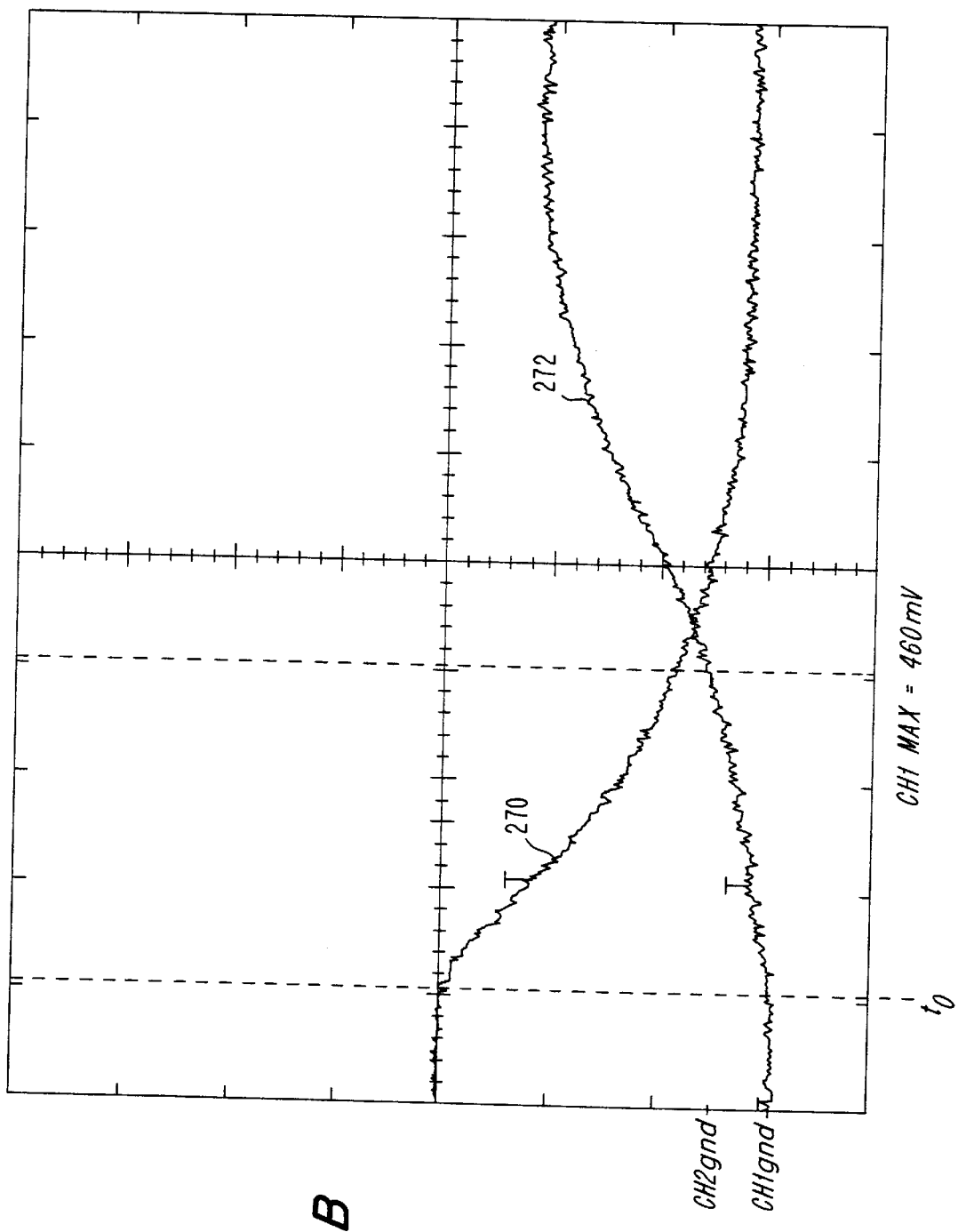

FIG. 3A
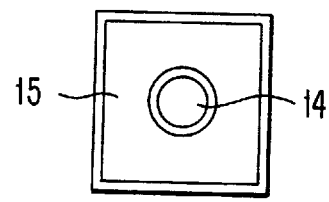
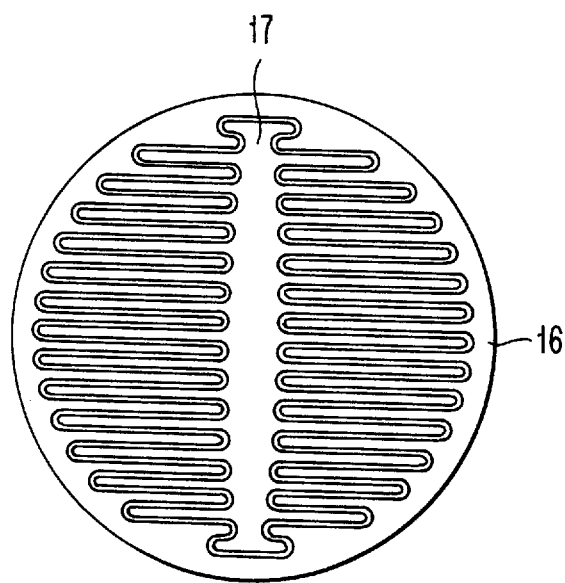
FIG. 3B

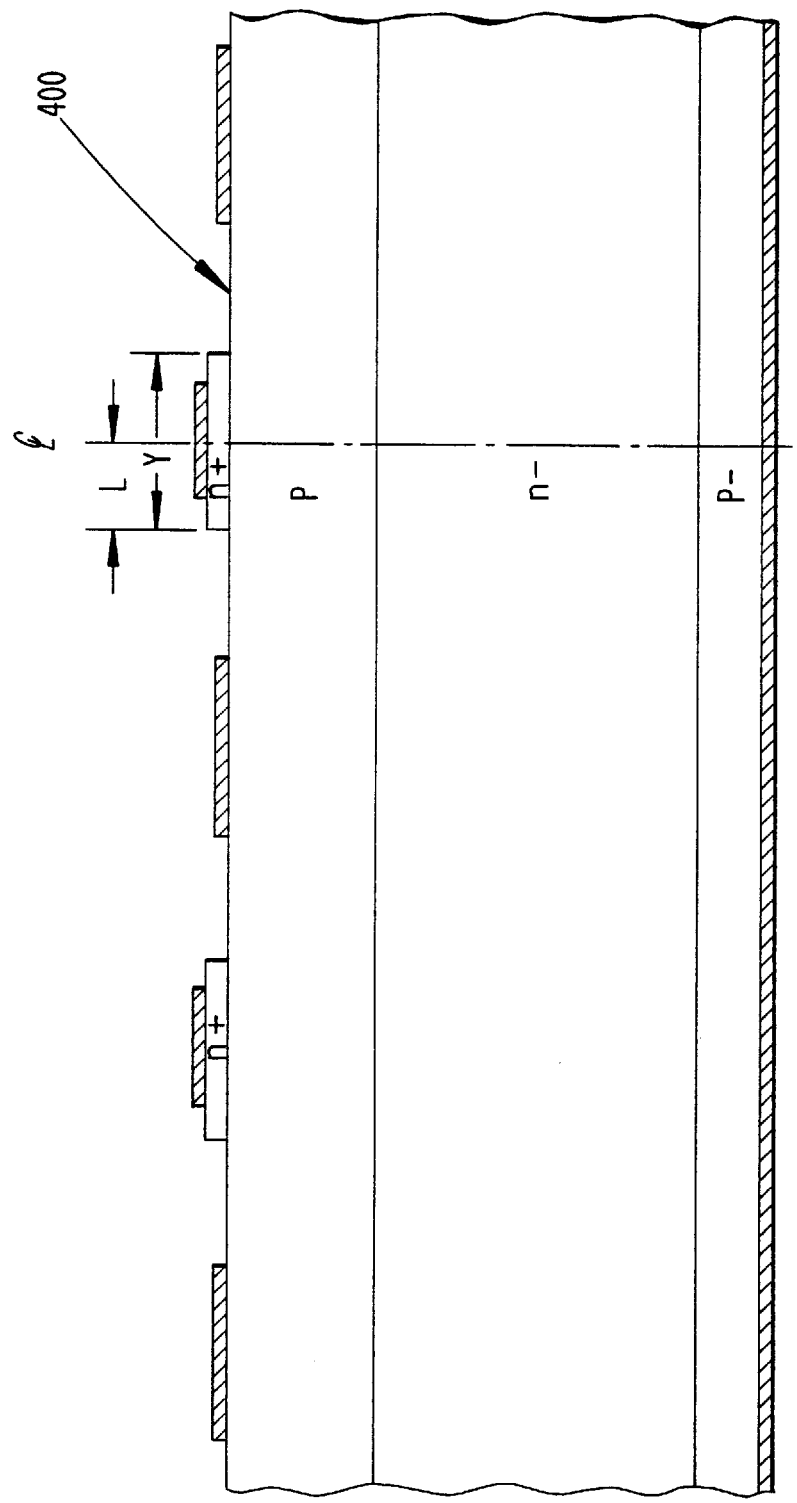

$\mathcal{E}_{OUT} < \mathcal{E}_{IN}$

TURBINE ENGINE IGNITION EXCITER CIRCUIT INCLUDING LOW VOLTAGE LOCKOUT CONTROL

RELATED APPLICATION

This application is a divisional of application Ser. No. 08/598,904, filed Feb. 9, 1996, now U.S. Pat. No. 5,556,966, which is a Continuation-in-Part of U.S. application Ser. No. 08/207,717, filed on Mar. 9, 1994, now U.S. Pat. No. 5,592,118.

BACKGROUND

The present invention relates generally to high voltage power supplies and, more specifically, to an improved ignition exciter for turbine engine applications.

Turbine engine ignition exciters have evolved considerably since their inception in the 1950's. First generation ignition exciters incorporated vacuum tube spark gap switching devices and vibrator type chopper, or DC-DC converter circuits. Given the severe operating environment of a turbine engine, e.g. high vibration, temperature extremes and widely varying input voltage and load impedance conditions, considerable effort was expended to develop highly reliable first generation components and circuit configurations. First generation exciters provided no way for aircraft or engine control, or feedback from the igniter plug to the exciter circuitry. Subsequently units ran open-loop. Following the introduction of the EEC (electronic engine control) computer and subsequent decline in former hydromechanical engine control devices, second generation ignition exciter circuitry developed.

Second generation ignition exciters were typically characterized by replacement of spark gap switching technology with a semiconductor switching device. These exciters commonly utilized three terminal (thyristor) switching devices to accomplish switching. This technology offered more precise spark timing and communication with an electronic engine control computer since feedback information could be effectively processed by the exciter charge pump (DC-DC converter) section. This provided a significant improvement over first generation devices, affording aviators considerably more control over the engine ignition process.

Conventional solid state ignition exciter circuits generally fall into one of two distinct categories. The first category being characterized by a series stack of switching devices to evenly distribute or divide the high (approximately 2–4 kV) tank capacitor voltage across each device. Such exciters incorporate elaborate voltage divider networks to protect the series ganged semiconductor switching devices from electrical imbalances generated during both the capacitor charge and discharge cycles. During the capacitor charge cycle, voltage must be evenly distributed across each device to prevent catastrophic failure of the entire series ganged semiconductor switching network. Likewise, during the discharge cycle, a series ganged back bias diode network is required to protect the switching devices from ring back which results during igniter plug firing. Circuits using this type of circuitry require careful screening and matching of thyristor leakage current and similar characteristics to ensure proper operation at elevated ambient temperatures. Moreover, this technology is electrically inefficient since the combined losses of several individual switching elements (during on-state) are very high.

By contrast, a second current circuit design philosophy incorporates a single thyristor switching device operated at a comparatively lower (0.4–1 kV) tank voltage. This approach offers considerably higher efficiency than the first design philosophy since only a single (VI) loss is incurred rather than multiple losses experienced with the aforementioned series ganged approach. However, this benefit is quickly offset since the tank capacitor voltage must be significantly lower than the series ganged approach to avoid using "hockey puc" type switching devices. While "hockey puc" type switches would offer adequate voltage ratings, their considerable bulk, weight and limited di/dt capability preclude their use in pulse discharge type circuitry. Therefore, current designs tend to utilize roughly 1,500 volt rated (phase control type) thyristors with correspondingly lower tank voltage.

This approach has two primary drawbacks. First, tank capacitor volumetric efficiency is generally low due to the low energy storage voltage ($E=\frac{1}{2}CV^2$). To reliably fire (ionize) low voltage, e.g., 2–3 kV, igniter plugs, exciters of this type employ pulse networks to boost the low (0.4–1 kV) tank voltage to the necessary igniter ionization voltage. Consequently, exciter output ionization voltage is limited to low voltage semiconductor igniter plug applications since losses incurred in the exciter discharge pulse forming network become excessive when high step-up transformer ratios are used. Moreover, regardless of transformer ratio, the transformer itself has considerable inductance and a saturable core to protect the semiconductor switching device from high di/dt generated during pulse network charge period, thus decreasing transformer efficiency.

Increased transformer losses tend to limit exciter peak power/duration while lowering overall electrical efficiency. Hence, ignition system performance is compromised. When used with low voltage igniter plugs under extreme operating conditions such as high combustor pressure, water or fuel fouling, ionization energy (pulse) provided by the exciter pulse network may be insufficient to properly ionize igniter plug resulting in a quenched condition. To alleviate this problem, larger pulse transformers can be employed which increase pulse duration, however, at the expense of exciter volume/weight performance. Realistically, a point is reached where pulse network technology cannot overcome quench losses, since output PFN pulse duration is on the order of several microseconds and a quenched igniter can require (ionization) input voltage waveforms on the order of several hundred microseconds before sufficient charge is accumulated to ionize the igniter plug gap.

To date, both types of solid state semiconductor switch exciter circuits have incorporated off-the-shelf, commercially available, phase control type thyristors. These devices, while readily available in commercial markets, are designed primarily for 60 Hz power control applications. Consequently, the dv/dt and di/dt ratings of these devices is limited with respect to requirements of a pulse power discharge application. The following summary provides a background of various thyristor technologies conventionally available for switch exciter circuits.

Phase-Control Thyristors are designed to maximize the silicon for use as active emitter area at 60 Hz AC. The devices have large, shorted emitters (for high dv/dt) with single-point center gates, and depend on the relatively slow plasma spreading to turn on emitter areas remote from the point center gate. Researchers have extensively examined the spreading velocity by viewing radiative recombination of the plasma. Despite comprehensive research, spreading resistance of conventional devices necessitates low di/dt performance relative to turbine engine ignition exciter requirements.

Inverter Thyristors have distributed or interdigitated gates (for high di/dt), similar to transistor emitter patterns, to turn on and utilize larger initial areas of the emitter for faster turn-on. For faster turn-off, heavy gold or platinum diffusion and/or electron radiation reduce carrier lifetime, thereby reducing thyristor turn-off times (tq). Unlike transistors, inverter thyristors have heavily shorted emitters to prevent latch-up when dv/dt is being applied. These inverter design features allow thyristors to be used at high (up to 10 kHz) repetition rates, but at the expense of high forward voltage drop. High forward drop severely limits performance of these devices in turbine ignition applications since increased (VI) power loss accelerates onset of thermal runaway, limiting upper temperature performance.

Gate Assist (GATO) and Gate Turn-Off (GTO) Thyristors have npn regions which are designed like high-speed transistors, where the gate (or base) is used for charge-control functions. In GATO closing switches, the gate is used to extract charge from the gate emitter junction during the tq and dv/dt switching interval. This allows high rep-rate performance without the adverse on-state voltage trade-off of lifetime-controlled inverter SCR's. The disadvantage of GATO's is the requirement for negative gate bias and current during the off-state and commutation interval, which considerably increases the complexity of exciter (thyristor) triggering circuitry. Gate Turn-Off Thyristors (GTO's) are similar to GATO's but must be lifetime controlled to act as opening switches. GTO's are made with both symmetric and asymmetric structures. Asymmetric GTO's are made both with and without anode shorts. The best turn-off gains for GTO's are obtained with shorted anode, asymmetric structures. So far, some of the highest di/dt pulse power closing switches have been GTO-type structures. These GTO emitter structures are ideally suited to receive and distribute high turn-on gating currents. If opening is not required, the highest possible hole-electron lifetimes will lead to the lowest possible on-state voltage. Therefore, GATO is perhaps the best conventional semiconductor switch structure for pulse-power applications such as turbine engine ignition systems.

MOS-Controlled Thyristors (MCT's) are integrated arrays of paralleled GTO cells (on the order of 20 micron spacing), with complementary FET's connected from anode to gate and gate to cathode. All of the cells have turn-off FET's that act as gate cathode shunts during turnoff and during the off-state. Some of the MCT cells have turn-on FET's connected from anode to gate. For those turn-on cells having their own anode-gate FET, the upper-base spreading resistance under the emitter is low, and good gate emitter injection is assured for good di/dt. However, not all cells have turn-on FET's and area utilization (60%) is not as good as with GATO's (>85%), precluding use of devices in volumetric/weight sensitive aviation turbine engine applications. Furthermore, MCT gate-yield considerations limit the active area to about 1 cm². High-current high-voltage applications are therefore better served by GATO-type designs, even though the turn-off function is not required.

SUMMARY

Accordingly, it is an object of the invention to provide improved turbine engine ignition exciter technology which allows volumetrically efficient, lightweight, and high reliability operation at ambient temperatures equal to, or exceeding existing ignition exciter designs. The present invention achieves these improvements through use of a specially designed Pulse Power Thyristor (PPT) semiconductor switching device. Turbine engine ignition exciters according to exemplary embodiments of the present invention are considerably different than conventional exciters since multiple series ganged, or single low voltage phase control type thyristor design approaches are replaced with a PPT thyristor specifically designed for pulse discharge applications.

The PPT thyristor is constructed such that it is capable of nearly unlimited di/dt, thus eliminating the need for specialized output Pulse Forming Networks (PFN's) such as saturable reactors and the like. Moreover, by offering extremely high di/dt, at elevated temperature, while reliably blocking nominal 2–5 kV tank voltage, the PPT allows solid state exciters to utilize bona fide high voltage, e.g., greater than 10 kV, PFN's. That is, the PPT can directly drive transformer-capacitor type pulse forming networks to achieve true high voltage output without damage to the PPT.

According to one exemplary embodiment of the present invention, a transformer-capacitor type PFN can be configured so that the pulse capacitor is charged by energy which is transferred from the tank capacitor upon triggering of the device. Alternatively, according to another exemplary embodiment of the present invention, a transformer-capacitor type PFN can be configured so that both the pulse capacitor and the tank capacitor charge simultaneously. This latter configuration has the added benefit of reducing stress on the pulse capacitor and creating a more efficient output because all of the tank capacitors stored energy is available to the output waveform created for the plug.

Another benefit, in addition to the ability to reliably tolerate high di/dt, is the ability of PPT based exciters according to exemplary embodiments to provide higher peak power (shorter spark duration). Ignition system peak power is known to significantly improve engine light off performance when fuel is poorly atomized, whether through improper fuel control or ambient (low temperature) conditions. The present invention allows improved altitude re-light performance and reliable ignition of engines under such conditions through elimination of saturable reactor type output networks.

The pulse power thyristor based exciter, by virtue of, for example, its ability to directly switch relatively high (>2 kV) tank voltage, eliminates the conventional need for multiple thyristors and associated charging/back bias voltage divider and protection networks. Thus, exemplary embodiments of the present invention offer considerably higher reliability (through lower parts count) over a variety of electrical and environmental conditions since a single device is used for switching rather than multiple series ganged devices.

Likewise, the PPT switching device is a significant improvement over conventional single thyristor exciters since it is specifically designed for pulse discharge applications. For example, the nominal (breakdown) voltage rating of PPT devices according to exemplary embodiments is greater than, for example, 5 kV. Consequently, despite high (for example, 3–3.5 kV nominal) tank voltages, reliable circuit operation over the entire environmental and input voltage envelope can be achieved.

It is another object of the present invention to offer improved electrical discharge efficiency through use of a single pulse power thyristor type switching device rather than series ganged thyristors. Since a single semiconductor switching device is utilized, power dissipated across the exciter switching network is minimized to a single device voltage drop rather than multiple (typically 2–4) voltage drops associated with conventional series ganged designs.

Another feature of the present invention is protection against low input voltages. Exciter circuits according to the present invention can, for example, be used in turbine engines of aircraft for ignition. In this exemplary application, the exciter circuit may be connected to a nominal 28 volt supply. However, due to various circumstances, such as a reduced battery voltage due to, for example, engine starter drain or the like or adverse ambient conditions (e.g., high temperatures), the actual voltage delivered by the battery may be much less than its nominal rating. Under these circumstances, various elements of exciter circuitry according to the present invention may be subject to additional electrical or thermal stress, e.g., fuses, the charge pump (diode power supply) and switching components. According to exemplary embodiments of the present invention, these adverse consequences are prevented by rendering the circuitry inoperative when the input voltage applied to the circuitry drops below a predetermined threshold.

According to other exemplary embodiments of the present invention, an alternative is provided to conventional techniques for operating exciter circuitry. In these conventional systems, exciter circuits were activated or deactivated by selective application of the input voltage. By way of contrast, Applicants' novel exciter circuitry provides constant application of input voltage to the exciter circuitry and instead provides control over activation of the exciter circuitry using a signal line that, for example, controls triggering of the PPT or the charge pump in the exciter circuit. This technique has, among other advantages, the benefit of reducing the amount of high gauge wiring necessary to configure the system in favor of smaller gauge signal wiring.

BRIEF DESCRIPTION OF THE DRAWINGS

The foregoing, and other, objects, features and advantages of the present invention will be more readily understood upon reading the following detailed description in conjunction with the drawings in which:

FIG. 1 is a block diagram of an exemplary ignition exciter assembly according to the present invention including a Pulse Power Thyristor (PPT) and automated feedback circuitry;

FIG. 2B is a graph illustrating waveforms generated using conventional semiconductor switching technology;

FIGS. 3A–3B compare cathode/gate metalization area of a standard 1.5 kV phase control thyristor with an exemplary PPT according to the present invention;

FIG. 4 illustrates an exemplary PPT emitter/base region geometric relationship, which allows immediate conduction of high (di/dt) current following a gate trigger pulse;

DETAILED DESCRIPTION

Figure 2A:
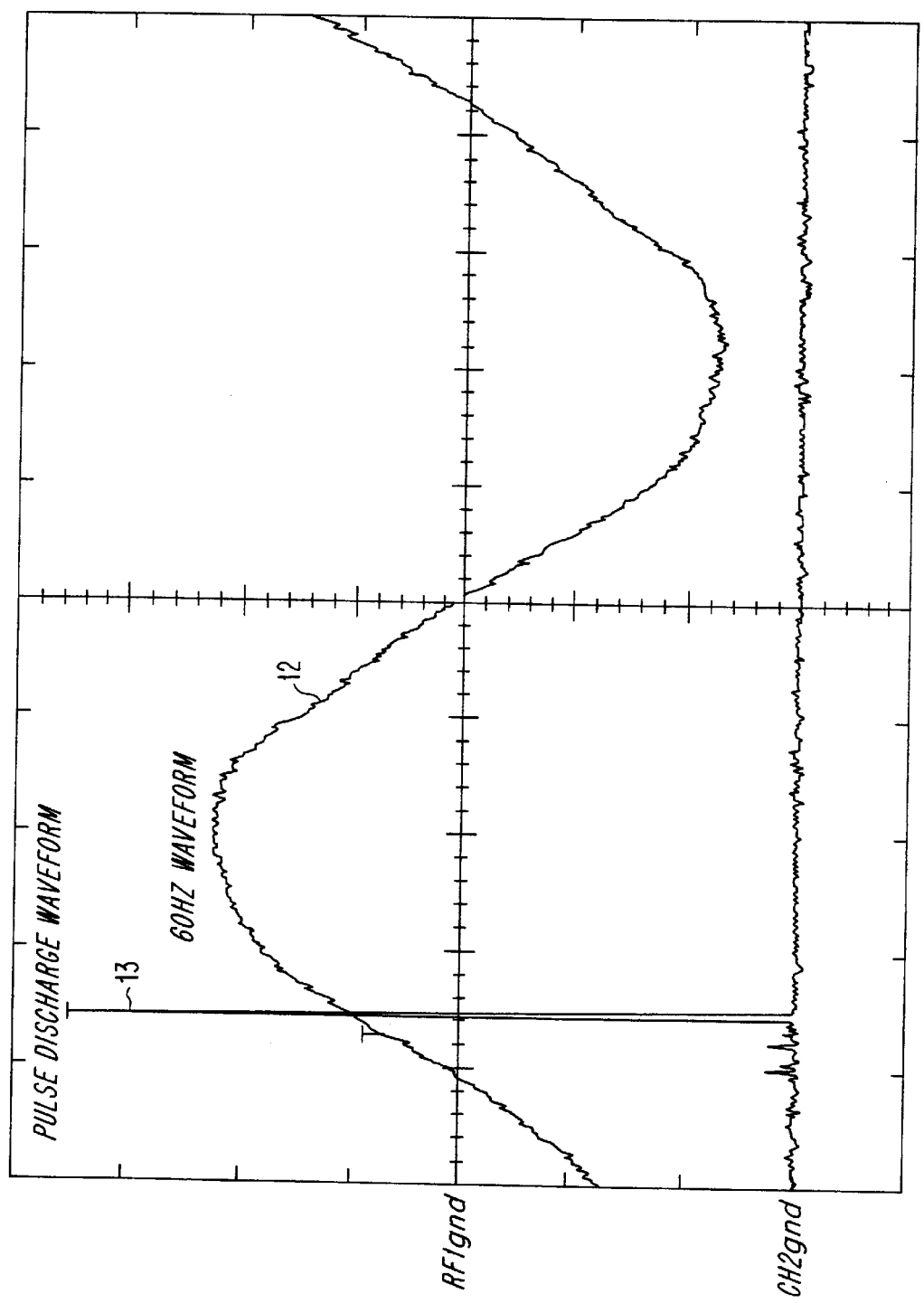
FIG. 2A is a comparison of a standard 60 Hz phase control waveform with an exemplary exciter discharge (pulse power) waveform from circuitry according to the present invention.

Referring to FIG. 1, block diagram operation is as follows. Input EMI filter 1 accepts input voltage from system level power supply. Filter 1 can be configured in, for example, either simple first order L-C, Pi, T, or common/differential mode topology (depending on program requirements) to protect sensitive exciter electronics, and surrounding systems in close proximity to the exciter from conducted/radiated emissions/susceptibility. The EMI filter 1 commonly incorporates reverse polarity diode protection (not illustrated) to protect the exciter from inadvertent application of incorrect input polarity.

Filtered input power supplied to the DC-DC converter 2 is transformed to high potential (on the order of, for example, 2–4 kV) for subsequent storage on energy storage device 3. Although this exemplary embodiment illustrates a DC input power, those skilled in the art will readily appreciate that an AC input power could also be used in conjunction with, for example, transformer rectification of the AC input power. To minimize effects of reflected load impedance on the input power supply, a flyback type converter arrangement is used. Unlike forward converters, half/full bridges and the like, flyback converters allow exciter circuitry to operate over a wide input voltage range (on the order of 10–40 Vdc), while maintaining constant energy storage device 3 (tank capacitor) voltage.

It will be appreciated by those skilled in the art, that when the exciter circuit is first activated, or has just discharged, the energy storage device (load) approximates a short circuit. Conversely, prior to discharge, energy storage device 3 approximates an open circuit. Reflected impedance of this widely varying load is minimized through use of, for example, flyback type DC-DC converter which effectively isolates input supply from tank capacitor load. The DC-DC converter can be configured using both current and voltage control feedback loops to maximize power transfer efficiency while minimizing heating within both magnetic components and semiconductor switching devices.

As charge is incrementally imparted on energy storage device 3 (which can be, for example, a tank capacitor such as a reconstituted mica capacitor), logic circuitry 4 monitors tank capacitor voltage. When energy storage device 3 has reached full charge, logic circuit 4 activates trigger circuit 5. The trigger circuitry may include an electromagnetic (transformer) coupling device or an optoelectronic coupling device. Regardless of the type of coupling used, trigger circuit 5 activates a single high voltage, di/dt thyristor switching device 6 allowing discharge of energy stored in energy storage device 3 to output PFN 7, and mating ignition lead (not illustrated) and igniter plug 8 (load) components. During discharge, the majority of energy stored in the energy storage device 3 is delivered to output PFN 7.

Following delivery of energy from energy storage device 3 to output PFN 7, energy is subsequently recirculated from the load, through PFN 7 by commutating diode 10, creating a unipolar output waveform. This increases spark intensity (heat for given stored energy) since the waveform does not repeatedly cross zero, creating an oscillatory power waveform. Likewise, commutating diode 10 protects switching (PPT) thyristor 6 from stressful reverse bias transients which would occur without the commutating diode. Those skilled in the art will appreciate, however, that commutating diode 10 can be omitted if unipolar output is not desired.

Exciter timing is accomplished by logic circuit 4. This circuit is constructed from a stable multivibrator which may be constructed in a variety of ways, as will later be described with respect to FIGS. 16 and 19. Logic circuit 4 provides a low duty cycle, low frequency output waveform with the period of the output waveform being inverse to the exciter spark rate. During the steady state operating case, logic circuit 4 generates pulses at any desired low steady state spark rate. Due to the low duty cycle, DC-DC converter 2 is activated only periodically. This causes the DC-DC converter to rapidly charge energy storage device 3, minimizing leakage current and power dissipation through single semiconductor switching device 6.

During periods of extreme igniter plug fouling, combustor pressure, or wear, igniter quenching may occur. To ensure igniter plug sparking occurs, the output waveform analysis circuit 11 can be provided to continuously monitor exciter output waveform (duration and amplitude), correcting output voltage, energy and spark rate, when igniter quenching occurs. By increasing exciter energy storage voltage, output voltage and energy are increased together as defined by $E=\frac{1}{2}CV$. Likewise, logic circuit 4 is directed to increase charge pump frequency. By doing so, extreme ionization voltage requirements of severely worn igniter plug gaps, and dielectric insulating influence of quench media, e.g. water, fuel or high combustor pressure are quickly overcome. By increasing exciter power output, quench media are quickly dissipated. It will be recognized by those skilled in the art, that any or all of the aforementioned parameters can be controlled by output waveform analysis circuitry 11 in a variety of different configurations. For example, circuitry can be configured with "time out" and manual override features to limit the amount of time that the exciter will attempt igniter "boost" operation and/or allow user override when a boost function is not desired. This prevents excess ignition system stress and allowing maximum operating flexibility. Moreover, for those systems not requiring diagnostics, waveform analysis circuitry 11 can be omitted.

The novel Pulse Power Thyristor (PPT) switching device, by virtue of its unique design and construction, is capable of driving a variety of output pulse forming networks. The unique "double gate" PPT thyristor schematic symbol seen in block 6 of FIG. 1 is used to differentiate the PPT device from conventional thyristor devices. Double gate leads denote the considerable interdigitation of gate and cathode structures and associated high (di/dt) current carrying capability of exemplary embodiments of the PPT according to the present invention. Unlike conventional phase control devices which are typically designed to handle comparably slow rise time 60 Hz sinusoidal waveforms, exemplary PPTs are specifically designed to reliably conduct pulse discharge waveforms.

FIG. 2A illustrates differences between 60 Hz sinusoidal 12 and typical turbine engine ignition discharge waveforms 13. Exciter discharge waveforms ideally have zero rise time, and durations on the order of 30–200 μs. Rise time is important to ensure reliable igniter ionization and exciter peak power. By contrast, a 60 Hz waveform has a low dv/dt and di/dt (long rise time), on the order of 4 ms, i.e., over two orders of magnitude longer. Thus, it is not surprising that the structure of conventional thyristors is not ideal for pulse power applications as will be discussed below.

FIG. 2B illustrates operation of a conventional semiconductor switching device in a pulse discharge application. Waveform 270 represents the gate drive (capacitor voltage) of the conventional semiconductor switch. When the energy storage device, i.e., capacitor, is charged to, for example, 80V, this voltage is discharged through the conventional semiconductor switch. This begins in FIG. 2B at time equal $t_0$. Waveform 272 illustrates the anode-cathode current of the conventional semiconductor switching device as a function of time. Note the low di/dt and considerable lag time before reaching peak current.

Figure 2C:
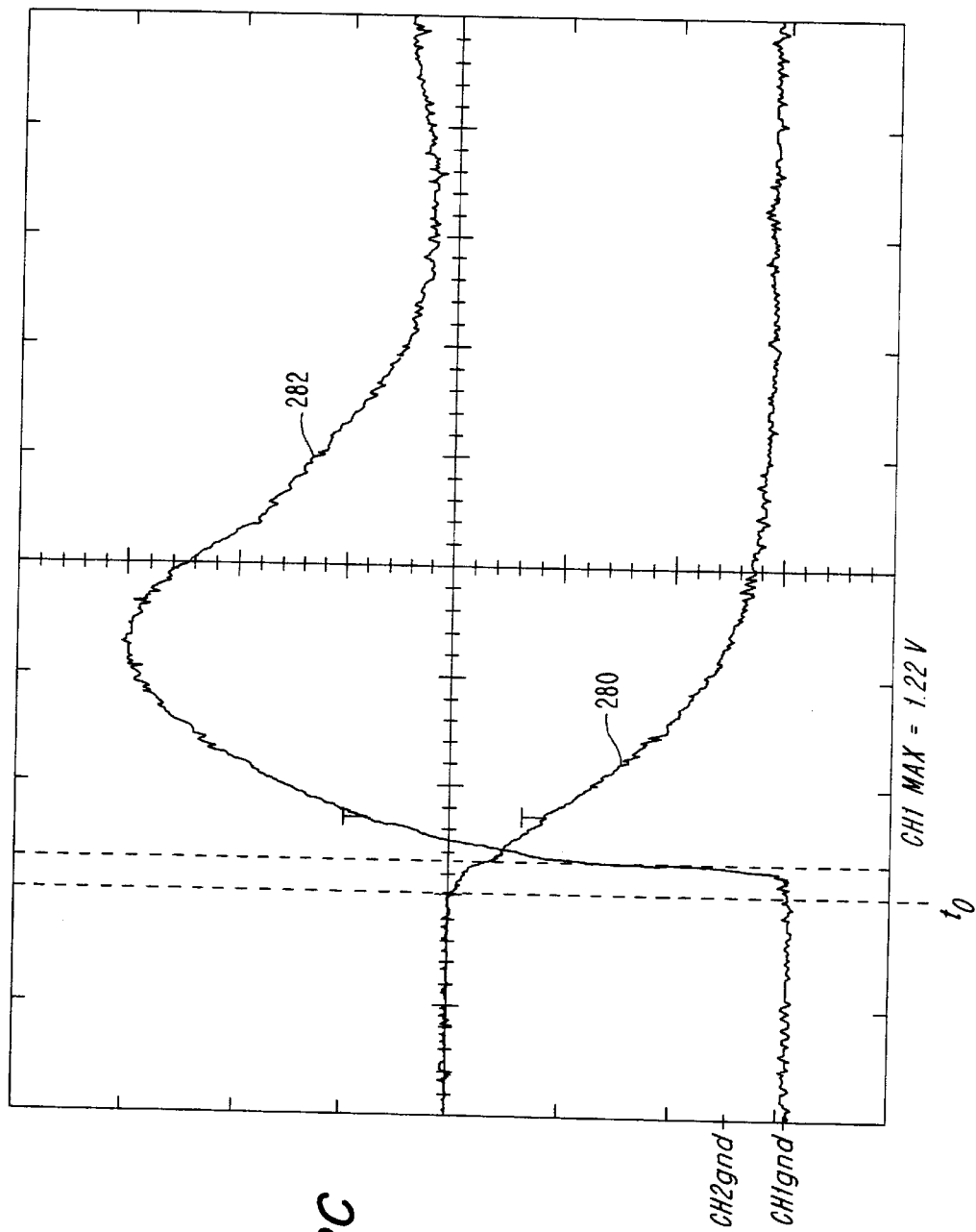
FIG. 2C is a graph illustrating waveforms generated by an exemplary PPT according to the present invention.

By comparison, FIG. 2C illustrates PPT operation according to an exemplary embodiment of the present invention. Waveform 280 is the PPT trigger capacitor voltage as a function of time, with triggering again occurring at $t_0$. Waveform 282 shows the anode-cathode current for the exemplary PPT. Note the virtually infinite initial di/dt after triggering.

Figure 2D:
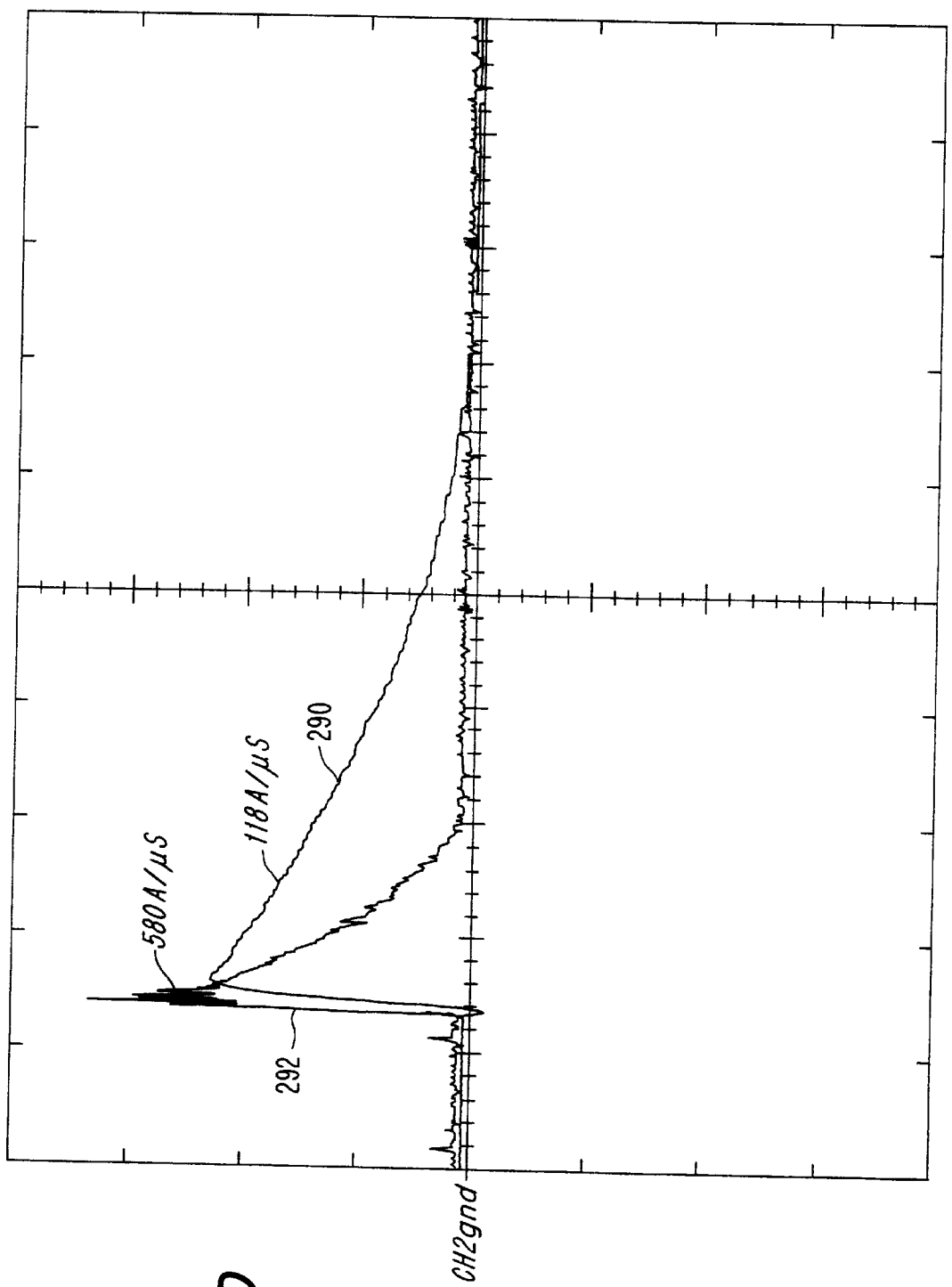
FIG. 2D is a graph comparing conventionally generated waveforms with waveforms generated according to the present invention on a different time scale.

FIG. 2D is provided as a more robust comparison using a different time scale for clarity of the conventionally generated waveform 290 and a waveform 292 generated when an exemplary PPT is triggered. Note the very different di/dts, i.e., about 580 A/$\mu$S for waveform 292 versus 118 A/$\mu$S for waveform 290.

FIGS. 3A and 3B illustrate differences in structure between traditional phase control thyristor structures and the novel PPT device. It will be noted that conventional phase control devices, generically illustrated in FIG. 3A, have thin intrinsic Si structures for limiting blocking voltage to $\leq 1.5$ kV and also have essentially point contact gate regions 14 surrounded by the cathode region 15. Conversely, the PPT (exemplified in FIG. 3B) utilizes interdigitated gate/cathode geometries 16 and 17. Note the relatively long gate/cathode periphery in FIG. 3B as compared with that of FIG. 3A. Interdigitation of the gate 16 and cathode 17 structures provides several important advantages relative to pulse discharge (di/dt) conduction. For example, when the device is triggered, gate charge is immediately distributed over the entire die face, thus eliminating plasma spreading resistance time delay. Likewise, the thick film, or solid metal cathode (comb) structure 17 more efficiently collects charge during conduction, thereby eliminating excess current density during high di/dt periods. Hence, this extremely compact device, e.g., having a package area of 1.5 in. by 1.75 in. or less, is well suited for the high rise time, di/dt waveforms associated with turbine engine ignition exciters. These qualities provide, among other advantages, for use of novel PFN configurations according to the present invention which were previously not possible using conventional phase control devices.

Referring to FIG. 4, unlike conventional thyristors, the PPT emitter and gate geometries are such that the emitter center line is everywhere equidistant from the gate region, and less than a single diffusion length L from the gating region 400. FIG. 4 also shows exemplary widths of the various layers for purposes of illustration. The emitter region width Y is maintained at, for example, less than or equal to 10 times the gate (P base) region which, in this example, means that the emitter width Y is less than or equal to 0.06 inches. This ensures maximum use of the entire emitter area during initial triggering. That is, during application of a gate trigger pulse, the entire emitter region is activated preventing concentration of charge in proximity of the gate connection which occurs in conventional point contact thyristor designs, i.e., gate 14 in FIG. 3A. This feature allows the entire device to modulate and conduct full anode current coincidental with the application of a (gate) trigger pulse. These qualities also allow circuits according to exemplary embodiments of the present invention to easily accommodate a variety of output PFN topologies which was not possible using conventional (phase control) thyristor technology.

Figure 5A:
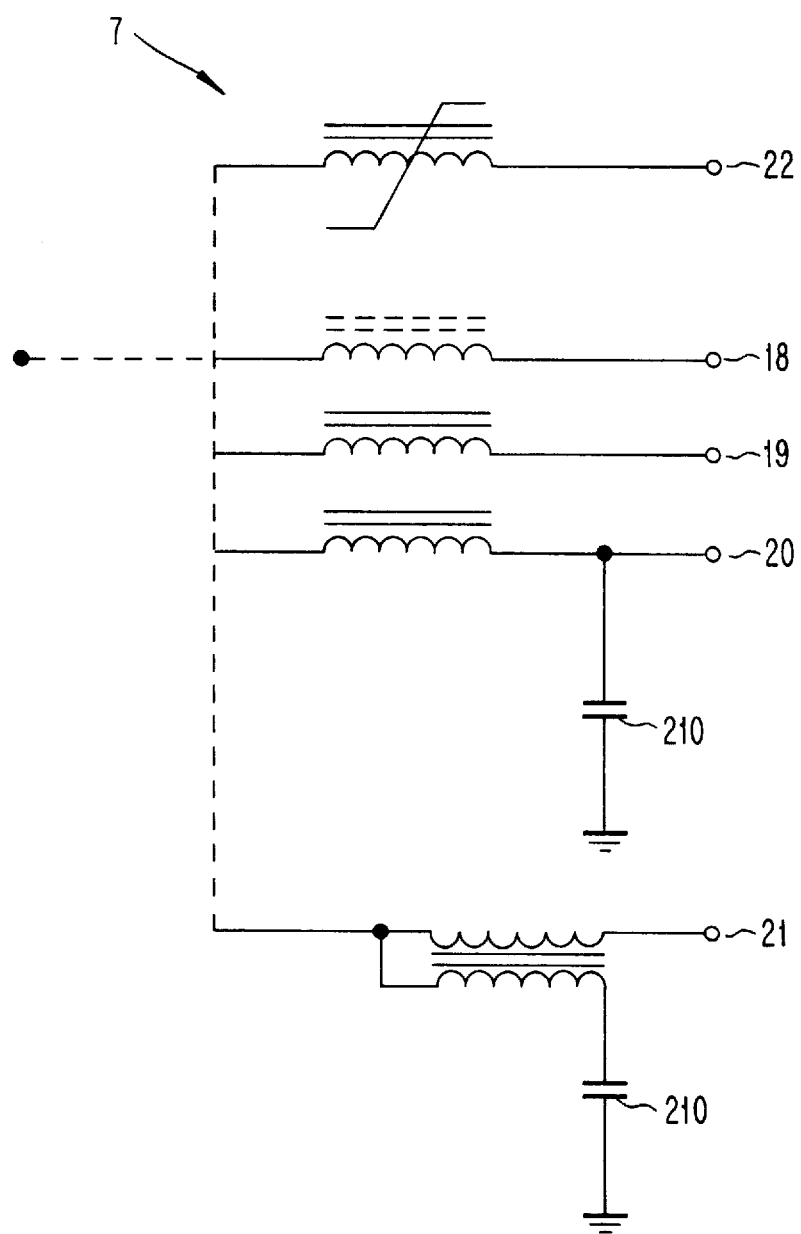
FIG. 5A illustrates various exciter output Pulse Forming Networks (PFN) which can be used according to exemplary embodiments of the present invention.

FIG. 5A illustrates several exemplary PFN's which can be used in exciter circuits according to the present invention.

Since the PPT single semiconductor switching device has practically unlimited di/dt capability, the need for a saturable output network 22, which was required in conventional exciter circuits having semiconductor switches, is eliminated. For example, an air core output 18, inductive output 19, L-C peaking output 20 and bona fide high voltage, e.g., capacitor-transformer networks 21, can be used in exciter circuits according to the present invention without di/dt or dv/dt failure. Moreover, exciters utilizing simple L-C peaking networks 20 operate with higher reliability since di/dt effects of the resonant peaking capacitors 210 do not adversely affect the PPT. Consequently, simple air core and peaking outputs 18 and 20 can be utilized with low voltage (e.g., 3–10 kV) applications, increasing exciter peak power (reducing spark duration), thus improving ignition system performance.

As described above, conventional devices intentionally limited the di/dt experienced by the semiconductor switch to avoid damage thereto. This was accomplished by, for example, the inclusion of large (e.g., on the order of 10 mH) saturable inductors in the output network connected to the switch. In addition to other drawbacks associated with using saturable inductors in this manner, the enforced low di/dt also reduces the magnetic coupling (i.e., efficiency in energy transfer) of transformers used in the PFNs of high tension applications to step-up the input voltage. To combat this problem in conventional exciters, large, bulky transformers can be used which both provide sufficient saturable inductance in their primary winding to protect conventional SCRs and adequately couple energy to the output. However, these large transformers create other problems in that the exciter package becomes heavier, bulkier and more expensive, which is commercially undesirable. Additionally, the greater the energy to be stored in the energy storage device for a given exciter design, the higher the primary inductance and the larger the magnetic material core size for transformers to both protect conventional semiconductor switches and adequately couple energy to the output.

However, use of Applicants' novel PPT in exciter circuits, which can withstand very high di/dt and, therefore, does not require protective saturably inductive output circuits to initially delay di/dt, allows for a remarkable reduction in the size of the transformer. Both primary inductance and core size can be reduced, which in turn reduces the size and weight of the exciter package. Two exemplary PFNs which include a transformer to step up the input voltage are described below.

Figure 5B:
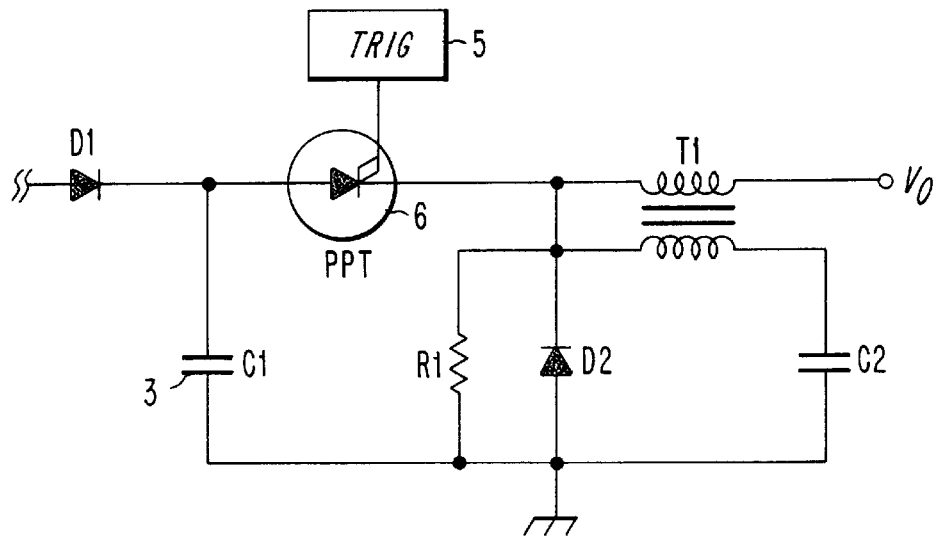
FIG. 5B illustrates an exemplary implementation of a transformer-capacitor PFN according to the present invention.

FIG. 5B illustrates one exemplary embodiment of a pulse forming network utilizing a transformer T1 and capacitor C2 combination. Therein, element C1 is the energy storage device 3 illustrated in FIG. 1, and trigger circuit 5 and PPT 6 operate as described above. The operation of this circuit is as follows. Initially, the capacitor C1 (energy storage device 3) is charged by the DC-DC converter 2 (not shown in FIG. 5B) via diode DI. When the PPT6 is activated by trigger circuit 5, a portion of the energy stored in capacitor C1 is delivered to transformer T1. Since the secondary load, e.g., a high tension igniter plug attached to $V_o$, initially acts as an open circuit, no energy is discharged through that path. However, a portion of the charge stored in capacitor C1 is provided to the pulse capacitor C2 via the primary winding of transformer T1. Pulse capacitor C2 creates a pulse current through the flyback transformer action of transformer T1 which results in a high tension output voltage waveform. This output waveform is sufficient to ionize the igniter plug gap, allowing the remainder of the energy stored in capacitor C1 to dissipated in the spark plasma formed between the contacts of the high tension igniter plug.

Figure 5C:
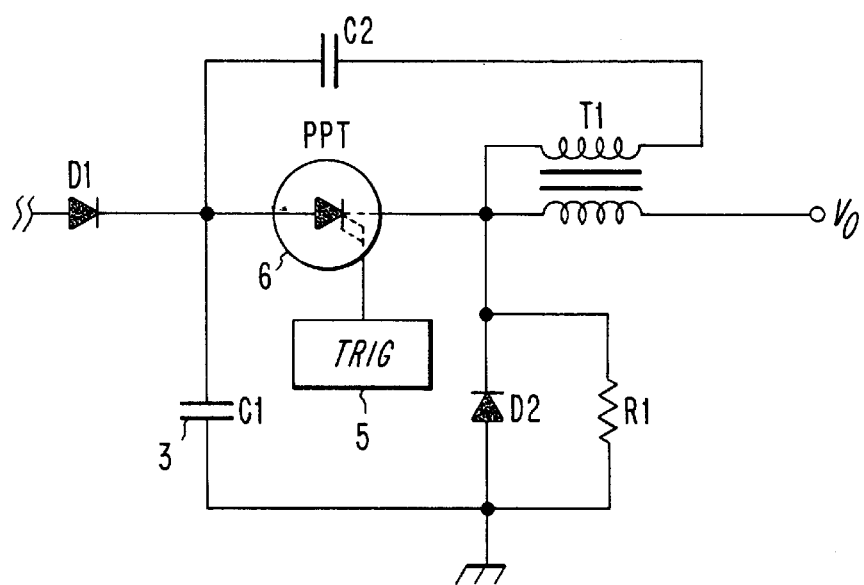
FIG. 5C illustrates another exemplary implementation of a transformer-capacitor PFN according to the present invention.

FIG. 5C illustrates an alternative exemplary topology for output PFN 7 utilizing a pulse capacitor C2 and transformer T1 combination. In this alternative exemplary embodiment, the system simultaneously charges the pulse capacitor C2 and the capacitor C1. Pulse capacitor C2 is charged through the primary winding of transformer T1 and safety resistor R1. Thus, the DC-DC converter 2 provides additional energy sufficient to charge both capacitors C1 and C2 at this time. During discharge, however, energy does not bleed from the capacitor C1 into the pulse network as in the exemplary embodiment of FIG. 5B. Thus, the energy stored in pulse capacitor C2 is shunted through the PPT 6 and the primary winding of transformer T1 resulting in a high tension output.

Note that in neither example provided above does the transformer T1 significantly delay the current rise (di/dt) experienced by the PPT 6. This is due to the very low primary inductance relative to the amount of energy stored in the energy storage device 3. For example, given an exciter according to the present invention which stores more than 2 kV, e.g., approximately 3 kV, in the energy storage device 3, the primary winding of transformer T1 can be less than 25 microhenrys and preferably less than 20 microhenrys, e.g., 15.6 microhenrys. Moreover, the core volume of transformer T1 can be less than 1.5 cubic inches and preferably less than 1 cubic inch, e.g., 0.92 cubic inches. This combination of transformer characteristics is possible due to the very high di/dt which the PPT is capable of handling and results in a relatively small exciter package with excellent performance.

Figure 5D:
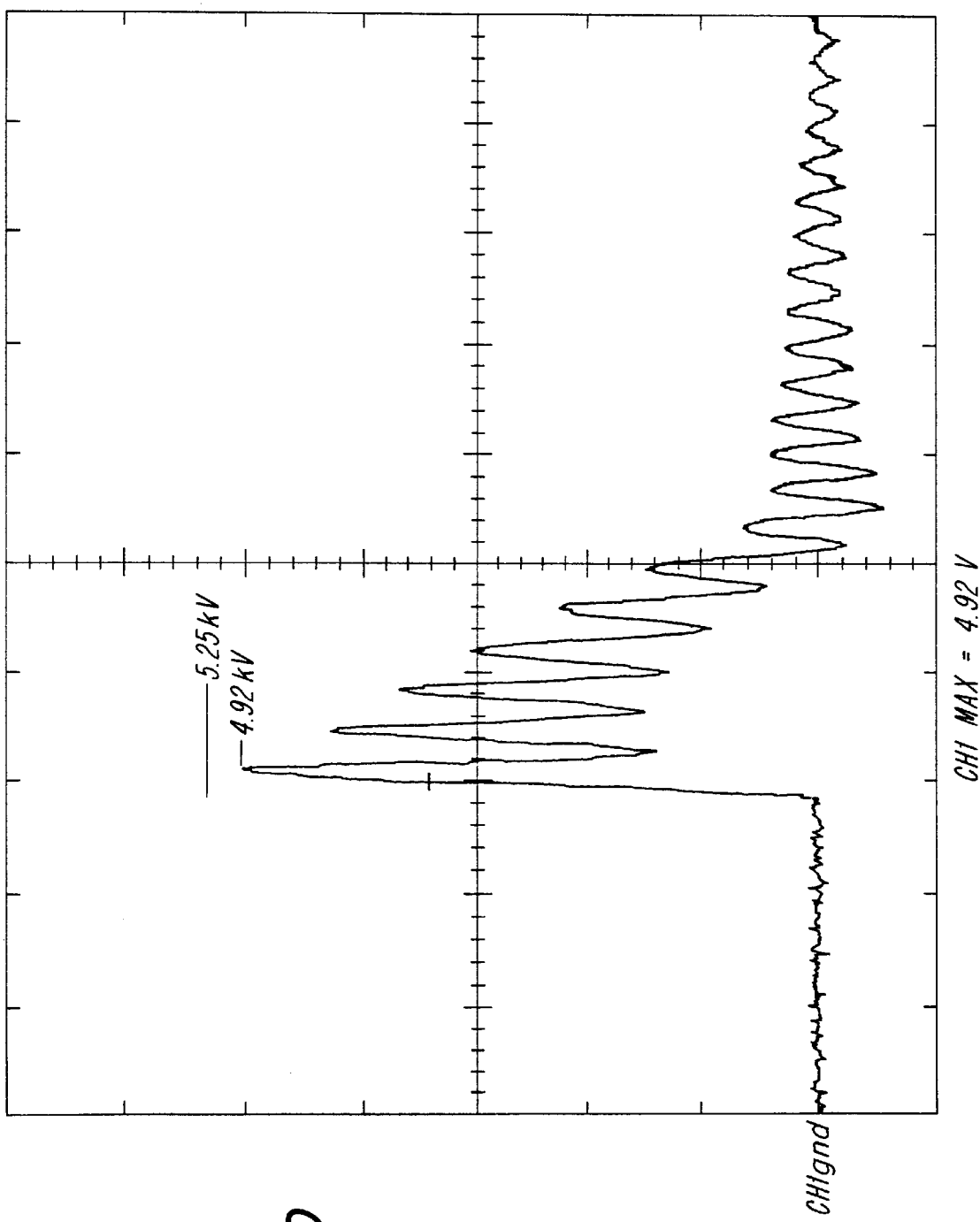
FIG. 5D is a graph illustrating voltage across the pulse capacitor for the exemplary implementation of FIG. 5B.
Figure 5E:
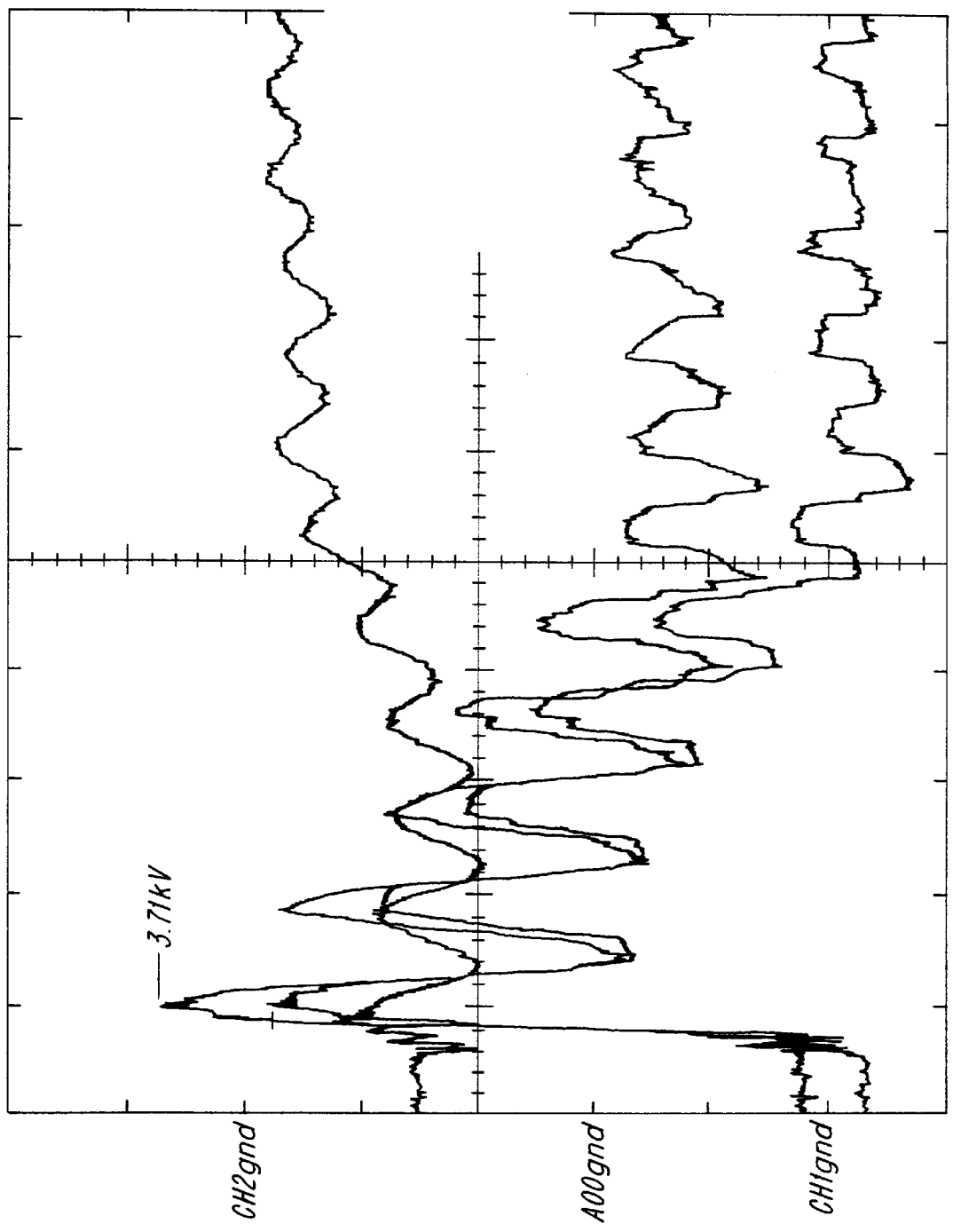
FIG. 5E is a graph illustrating voltage across the pulse capacitor for the exemplary implementation of FIG. 5C.

The topology described in FIG. 5C provides several benefits when compared with that of FIG. 5B. For example, the topology of FIG. 5C reduces voltage ring back stress (i.e., amplitude oscillations of the stored voltage) on the pulse capacitor C2. This beneficial effect can be seen by comparing the waveform of FIG. 5D (voltage across the pulse capacitor C2 for the configuration of FIG. 5B) with the waveform of FIG. 5E (voltage across the pulse capacitor for the configuration of FIG. 5C) and noting the lower amplitude oscillation for FIG. 5E vs. FIG. 5D (3.71kV vs. 4.92kV). Moreover, discharge efficiency is improved since the energy stored in tank capacitor C1 is not expended on the pulse network. This also provides a greater exciter output voltage since all of the energy in the tank capacitor C1 can be used at the igniter plug.

Figure 6:
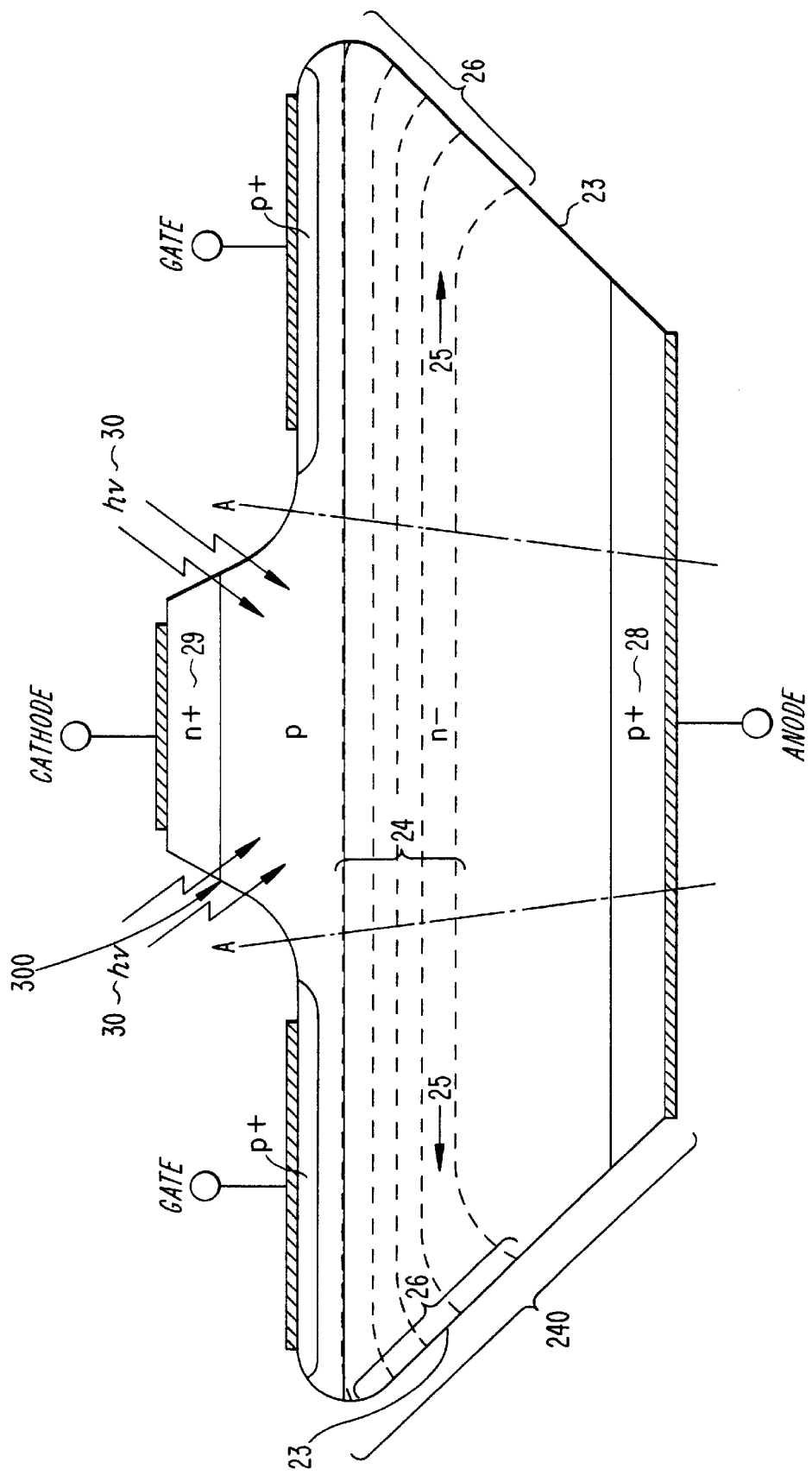
FIG. 6 is a cross-sectional diagram of a PPT illustrating the edge bevel region.

FIG. 6 illustrates a PPT structure according to an exemplary embodiment of the present invention. By positively beveling the PPT die at edge 23 so as to "spread out" electric field lines when the device is forward biased, rather than the traditional negative bevels (which tend to concentrate E field lines under a forward bias) utilized by most hockey puc type phase control devices, a number of advantages are realized.

At the edge of the chip, a unique pnp structure 240 is created by etching off the outer n+ region. Note that accordingly the N+ (cathode) region is not embedded in p-doped material. Since the (equivalent) npn transistor has been eliminated from the outermost regions, edge leakage current involves only the pnp structure. Additional etching, to the n-region, further reduces edge leakage to np diode levels by avoiding both npn and pnp gains. Since leakage current in the vicinity of the bevel edge area 23 is higher than in other areas, design according to this exemplary embodiment ensures that this surface leakage current will not be amplified by npn/pnp thyristor action.

The bevel edge area 23 has been beveled in a manner that results in "spreading out" of the electric (field) potential lines 24 in the edge region 25. This unique positive beveling ensures bulk field breakdown since the surface electric field is spread out over a longer distance 26 than the bulk electric field, thereby promoting maximum theoretical (bulk) breakdown. To further reduce leakage current, all edge regions 27 outside of lines AA can be treated with electron radiation, further reducing pnp gain and associated leakage current.

The emitter n+p junction and pn- regions 300 can also be made light sensitive by etching close to the pn- depletion regions. Triggering photons generate hole-electron pairs within these depletion regions resulting in injection from both p+ and n+ emitting regions 28 and 29. The device can thus be made sensitive to light radiation 30 by a unique etch which is pervasive over the entire gate-emitter length and provides exposure of n+p junction 300. This allows optional optoelectronic triggering as an alternative to electromagnetic triggering. The gate-emitter area is relatively great as compared to standard phase control thyristors because the device is extensively interdigitated. Due to considerably higher isolation achieved with optoelectronic coupling, exciter circuitry and "up stream" supply electronics are further protected from thyristor failure modes and effects.

Figure 7A:
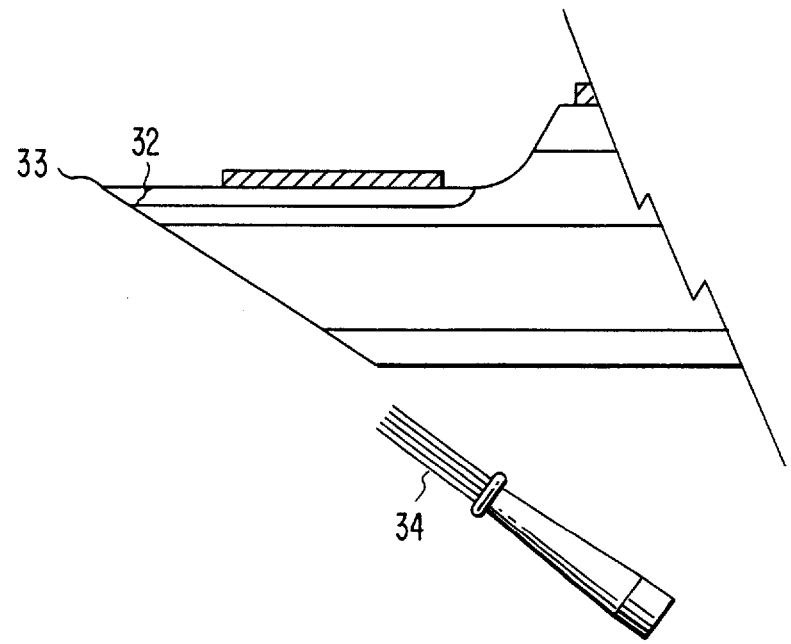
FIGS. 7A–7B illustrate different edge bevel (sand blasting) techniques and methods according to the present invention.
Figure 7B:
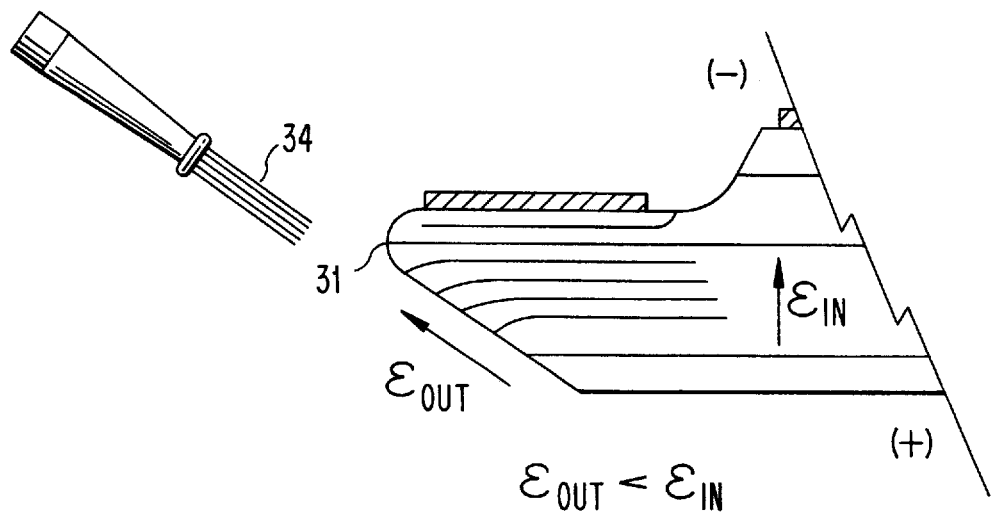

Referring to FIGS. 7A and 7B, PPT edge beveling techniques according to the present invention are illustrated. The rounded region 31 of FIG. 7B can be desirable since cracks and fractures 32 of FIG. 7A caused during processing and handling are minimized by elimination of sharp edge 33. Cracks and chips contribute significantly to, and can cause failure of, semiconductors since high leakage current and low breakdown voltage result therefrom. FIG. 7A illustrates a sand blast method of die edge beveling wherein sand 34 is blasted from the bottom of chip (die) toward the top. FIG. 7B illustrates a second method of forming the bevel where the sharp edges 33 are replaced by rounded edges 31. By inverting the direction of the sand blast, a blunt edge, less prone to cracking is accomplished. The sand blast profile 34 shown in FIG. 7B eliminates the sharp edge since the distribution of the profile is such that some of the sand contacts the edge to round it off.

Figure 8:
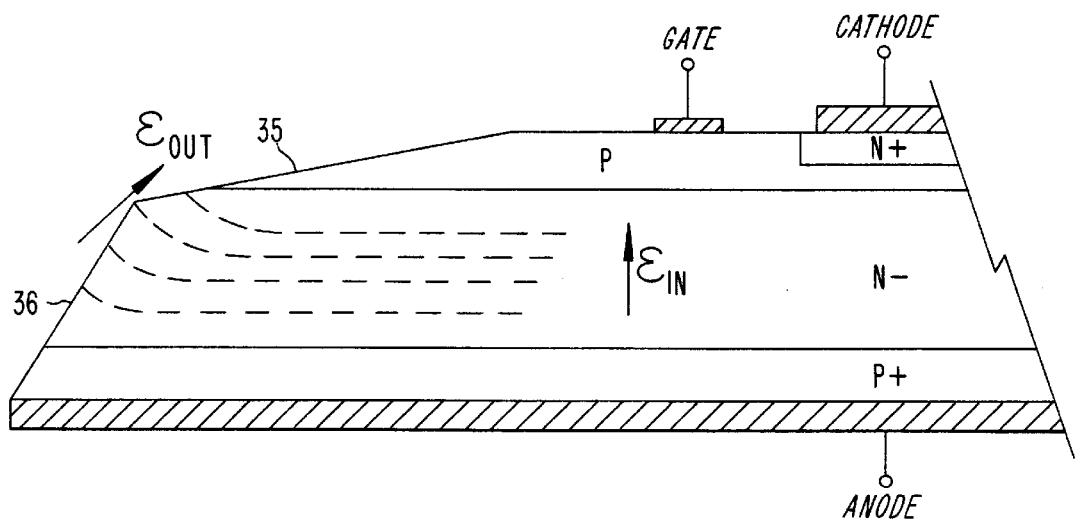
FIG. 8 illustrates a conventional hockey puc thyristor edge beveling technique.

By contrast, FIG. 8 illustrates the conventional bevels for large, e.g., ≈3 kV hockey puc type thyristors. Current thyristor structures use a double bevel angle, one negative 35, and one positive 36. Negative (Vbo) bevel 35 tends to concentrate E field lines when the device is forward biased (anode positive WRT cathode; forward blocking condition). This promotes dielectric breakdown at device surface rather than through (bulk) Si. Conversely, phase control devices (which typically must block voltage reliably bi-directionally (60 Hz sinusoid)) require a second "positive" bevel to protect the device during reverse (Prv) bias condition. That is, when sinusoidal stress reversed polarity occurs, positive bevel 36 (which would normally tend to spread (surface) E field concentration) actually concentrates the field near the interface with negative bevel 35, thereby protecting the device from same bulk breakdown phenomenon.

In contrast, a single PPT positive bevel 23 allows the device to realize (bulk) Si breakdown equal to theoretical Si breakdown. In comparison, traditional hockey puc devices such as that illustrated in FIG. 8 can only achieve, for example, 80% of theoretical (bulk Si) breakdown voltage; and must utilize considerably more Si and wafer "real estate".

These conventional devices have blocking voltages on the order of 3 kV and require 2×0.2" or about 10 mm (linear, over entire dimeteral surface) of Si be used for beveling. The novel beveling methods in FIGS. 7A and 7B according to the present invention require only about 2×0.032", or 1.6 mm Si for the bevel area. This feature provides economic fabrication of devices with diameters on the order of, for example, about 4–25 mm, which are capable of reliably blocking, for example, 2 to 6 kV.

Figure 9C:
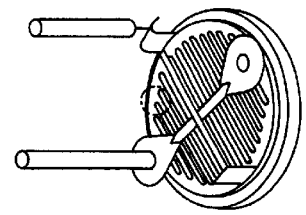
FIGS. 9A–9C contain both schematic and isometric representations of an emitter shorting technique according to the present invention used to increase PPT junction temperature ($T_j$)
Figure 9B:
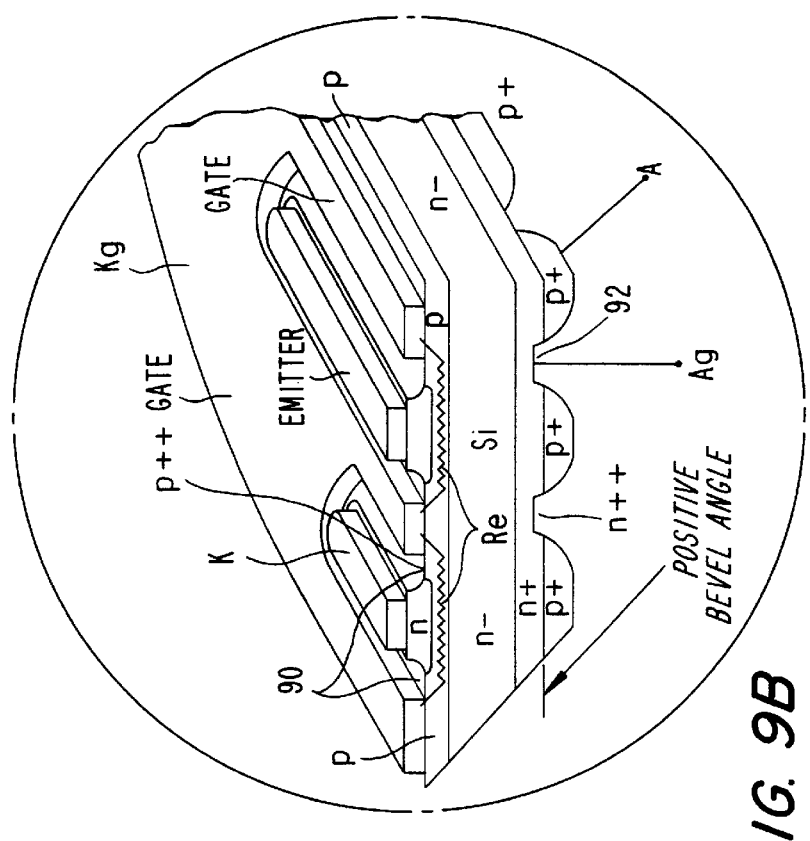
Figure 9A:
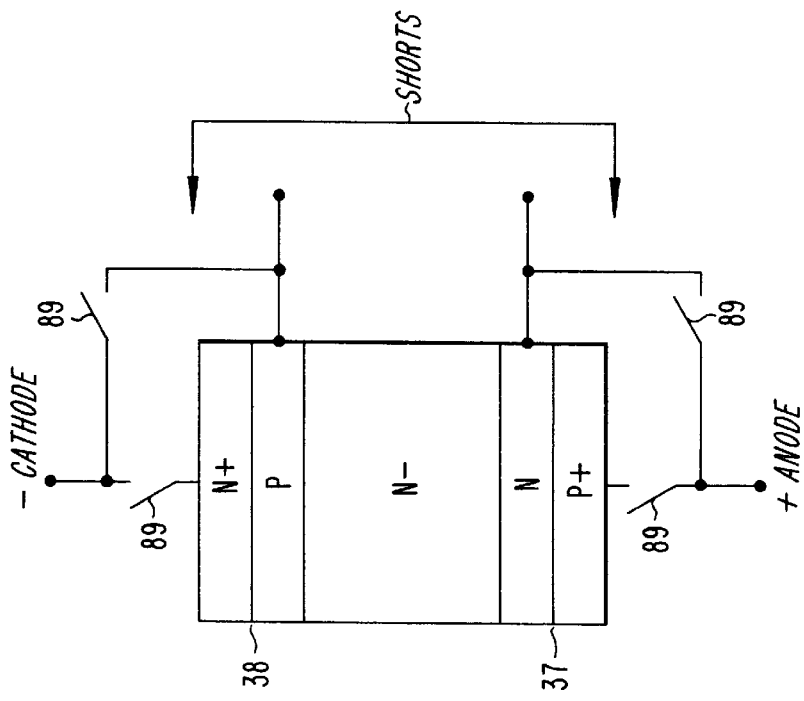

Referring to FIG. 9A, if both emitting injectors 37 and 38 of the PPT thyristor structure are shorted, the device blocks voltage like a diode. That is, by effectively shorting the p+n 37 and n+p 38 injecting junctions of the thyristor, npn and pnp gains are eliminated thereby reducing leakage current levels to those associated with diode structures and permitting high temperature ($T_j \geq 175°$ C.) operation.

FIG. 9B provides an isometric rendering of this emitter shorting technique. Anode shorting is accomplished by an etch down of the p region, e.g., at region 90, allowing penetration of n+, as depicted with Re (shunt resistors) and penetration of upper n+ layer into the p region. One method of cathode shorting, similar to the technique used for the anode side, involves building etched "holes" 92 in the lower p+ region which penetrate adjacent n+ material. These processes permit effective shorting of the cathode and/or anode emitters at low level (blocking current levels) such as those experienced during the energy storage device charge cycle, yet permits high current triggering and conduction at high conduction levels, such as those experienced during exciter discharge. Effective low level shorting and high level triggering is illustrated in the novel double sided etch down structure illustrated in FIG. 10.

Figure 10:
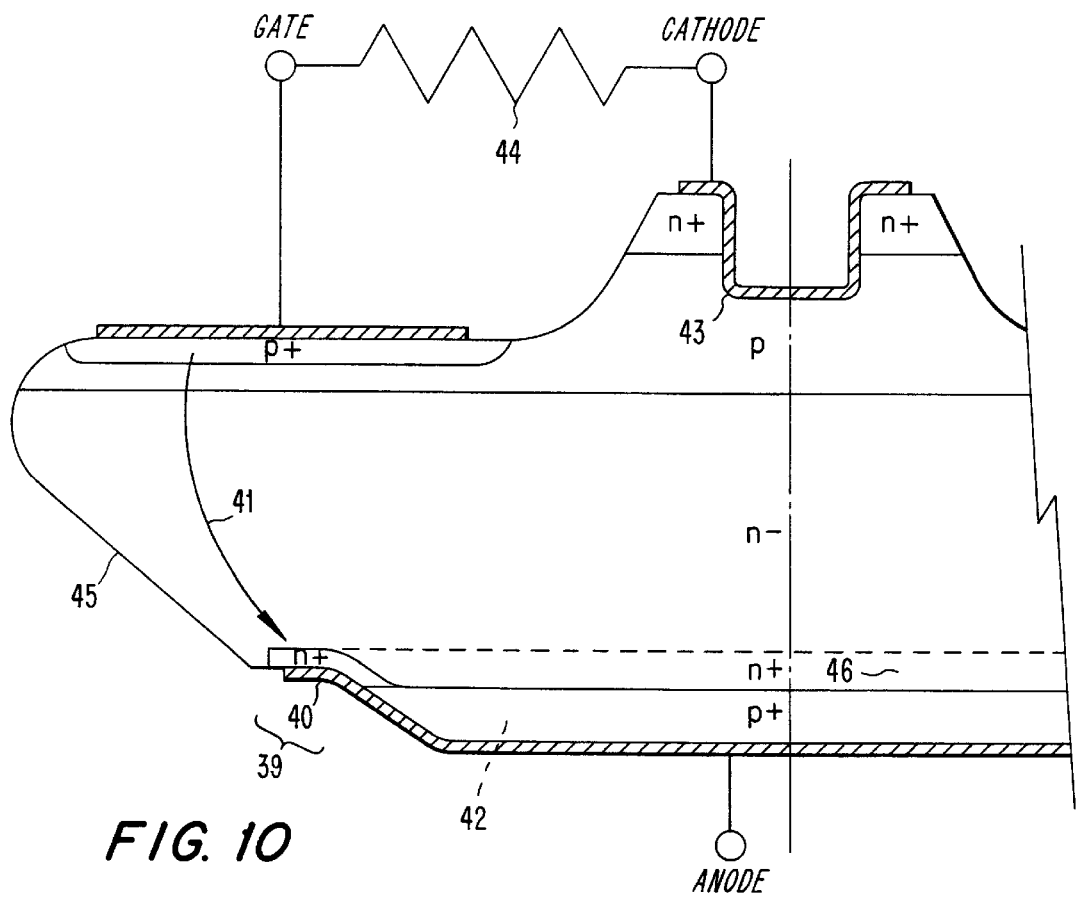
FIG. 10 provides a cross-sectional illustration of PPT asymmetric and integral back bias edge bevel geometries according to an exemplary embodiment of the present invention.

FIG. 10 illustrates a method according to an exemplary embodiment of the present invention for shorting both anode and cathode regions of both symmetric and asymmetric structures to achieve high blocking temperature capability and/or intrinsic inverse parallel (back bias) diode. Anode shorting reduces leakage current associated with imperfect passivation of the bevel area. Leakage current contributes considerably to exciter power losses during capacitor charge cycle. Likewise, since leakage current increases with temperature, exciter top-end operational temperature performance is limited. At high temperatures, thyristor leakage causes die heating which, if unchecked, will continue until catastrophic thermal runaway occurs. Anode shorting is accomplished by removing (either by grit blast or etch method, for example) the outer region 39 of the (P+) anode.

This procedure provides at least two significant advantages. First, a shorting metal such as Au—As 40 can be alloyed into the n- region making an efficient inverse diode 41. Second, by limiting application of anode metal to the outer periphery etch region, defined by zone 39, an efficient blocking diode structure is created at the outer periphery of the pnpn device. Thus, eliminating npn and pnp gain at the beveled surface (i.e., low leakage current), and providing reverse blocking voltage capability (asymmetric case). Cathode shorting can be accomplished by introducing internal shorts 43 over the entire emitter area or by providing external resistors 44 connected between cathode and gate terminals. This feature eliminates a problem associated with high temperature pnpn thyristor blocking voltage, i.e. pnpn leakage current is highest in vicinity of bevel area 45. Accordingly, FIG. 10 illustrates how the outer bevel area can be modified to eliminate pnp and npn gain due to leakage current along surface of bevel for both symmetric and asymmetric thyristor structures. It will be appreciated by those familiar with semiconductor processing, that an asymmetric thyristor device would contain an additional n+ layer 46, allowing good ohmic contact using Al or similar metalization.

Figure 11:
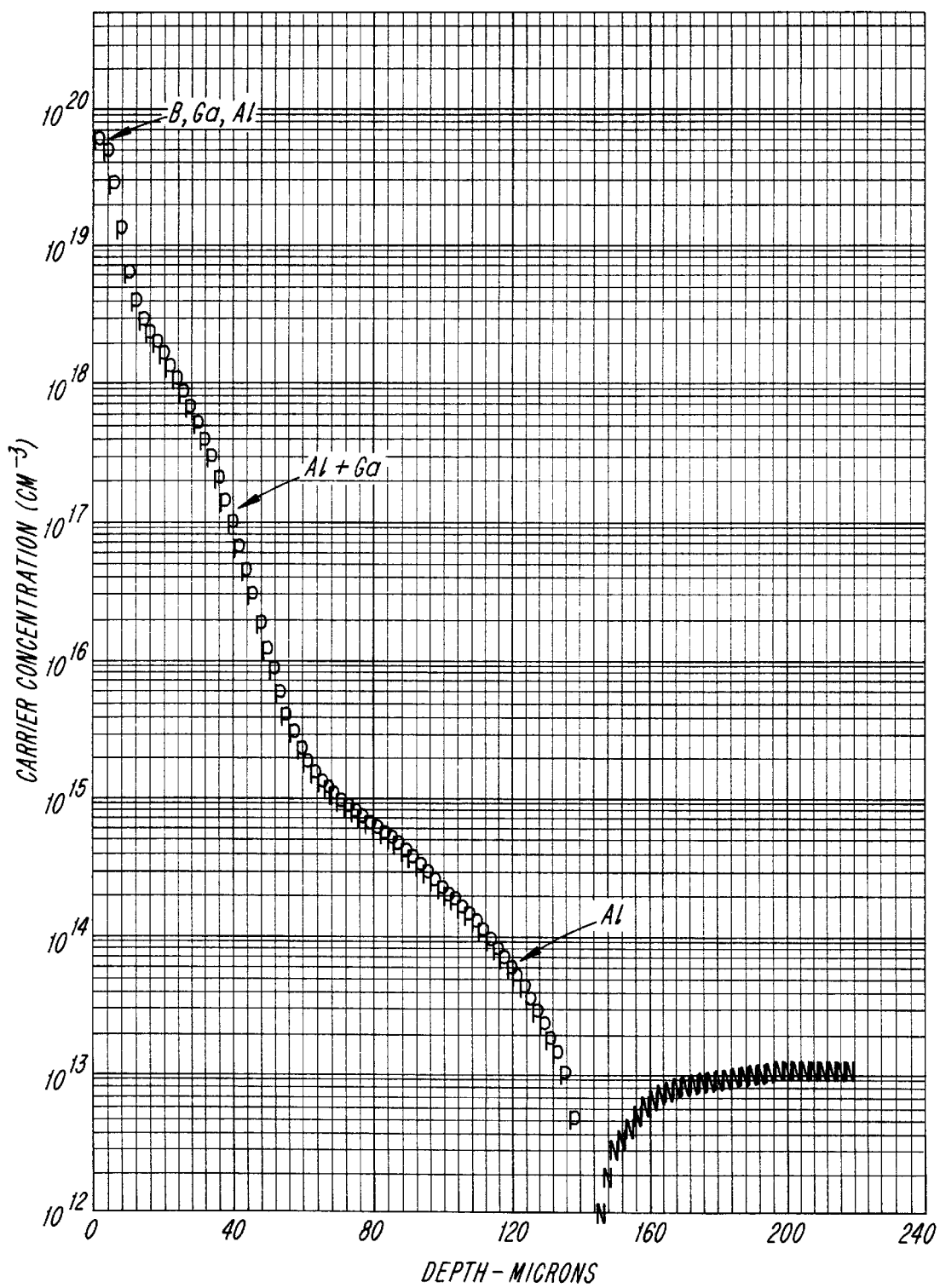
FIG. 11 graphically depicts an exemplary (anode) P region carrier concentration following ion implantation and diffusion of Al, Ga and B.

FIGS. 11–15 illustrate an exemplary manufacturing technique of the PPT according to the present invention. FIG. 11 illustrates the p region resulting from a diffusion of Al, Ga and B into both sides of a 37 mil thick Float Zoned Si wafer which was NTD (Nutron Transutated Doped) to approximately 10E13 ($cm^3$). The novel diffusion technique involves ion implanting and driving Al, Ga and B into the wafer with an approximately 16 hour 1275° C. diffusion cycle. To prevent device contamination, and associated excess leakage current, the Si is "capped" with layers of $SiO_2$—$Si_3N_4$—$SiO_2$ thus preventing entrance of contaminants and outdiffusion. The capping/oxide layer materials and order of application were developed to provide a complete "cocoon" around the Si wafer, preventing entrance of contaminants or out diffusion.

Likewise, the oxide layers have been optimized to prevent cracking of the capping layer. It will be appreciated that the invention utilizes an ion implantation technique whereby Al, Ga and B are ion implanted through the oxide layer. Al is used to achieve a deep (approximately 4 mil) junction for high voltage capability, with a reasonable (approximately 16 hour 1275° C.) diffusion. Due to the poor (approximately 4%) electrical affectivity of Al, Ga and B are introduced to increase concentration of active electrical acceptors for good ohmic contact and injection efficiency. By way of contrast, conventional technology requires very long, high temperature diffusions, for example, about 135 hours at 1275° C., which are consequently prone to contamination from impurities, e.g. Na, which diffuses through (quartz) diffusion tubes increasing leakage current.

To expand on this three element doping procedure, Al is used since it is a fast diffusing (P type) dopant which will dope an Si lattice properly with 16 hr. 1250° C. diffusion, as opposed to traditional B 135 hr. 1275° C. diffusion. Al is a good fit in Si crystal, yielding low crystal stress. Unfortunately, Al tends to bond with oxides creating oxide complexes lowering the effective doping to roughly 4%. Ga is used next to achieve higher doping concentration. Since Ga does not tend to form oxide complexes, it is a more efficient dopant. Again, diffusion time is short. Finally, B is used as a getter to "lift" impurities to the surface where they can be removed (etched off). Boron also provides improved ohmic contact. Ion implantation through oxide layer prevents out-diffusion and prevents contamination by, for example, Na, which would reduce carrier lifetime and increase leakage current.

Figure 12:
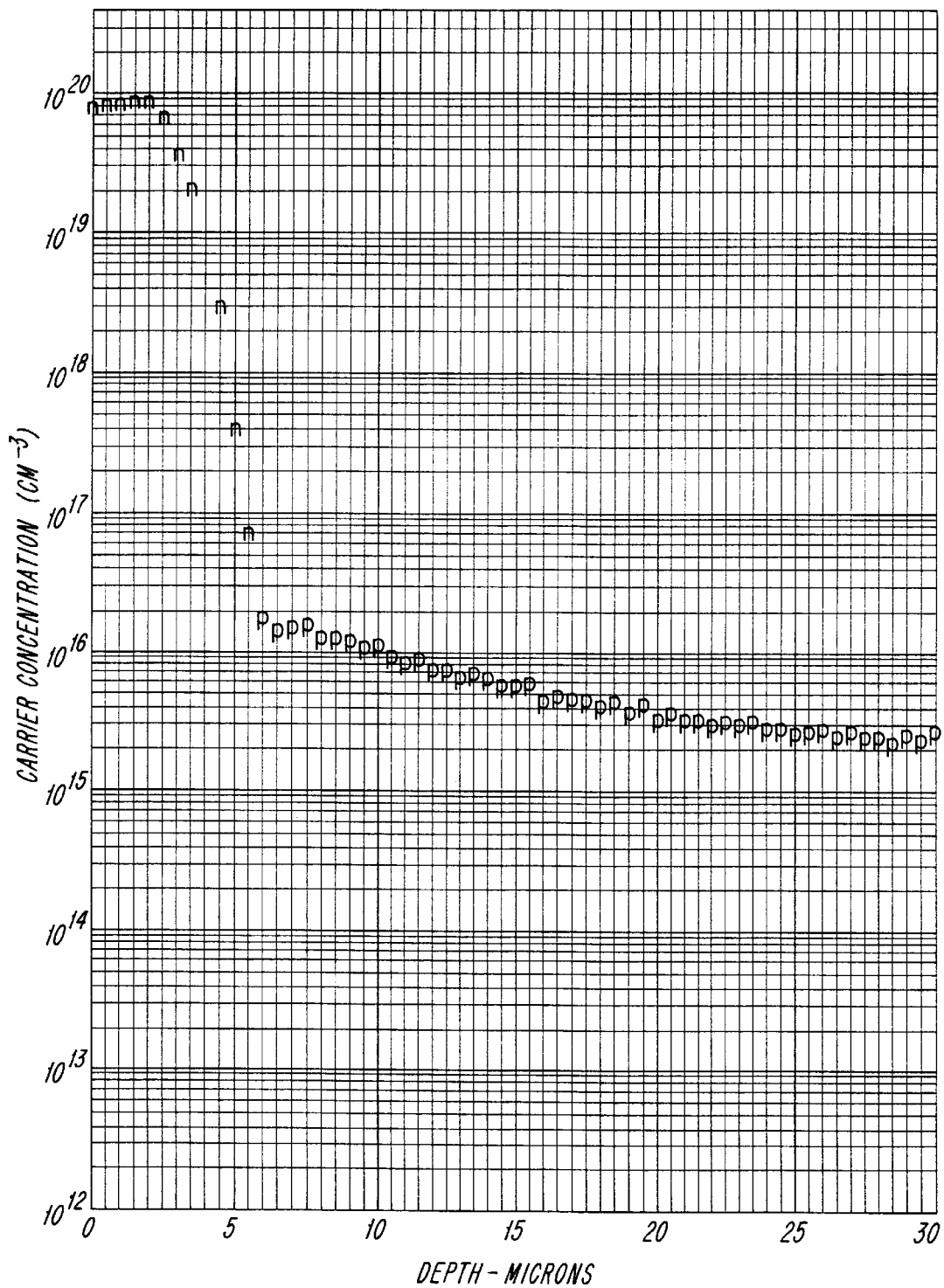
FIG. 12 illustrates an exemplary PPT cathode carrier concentration.
Figure 13:
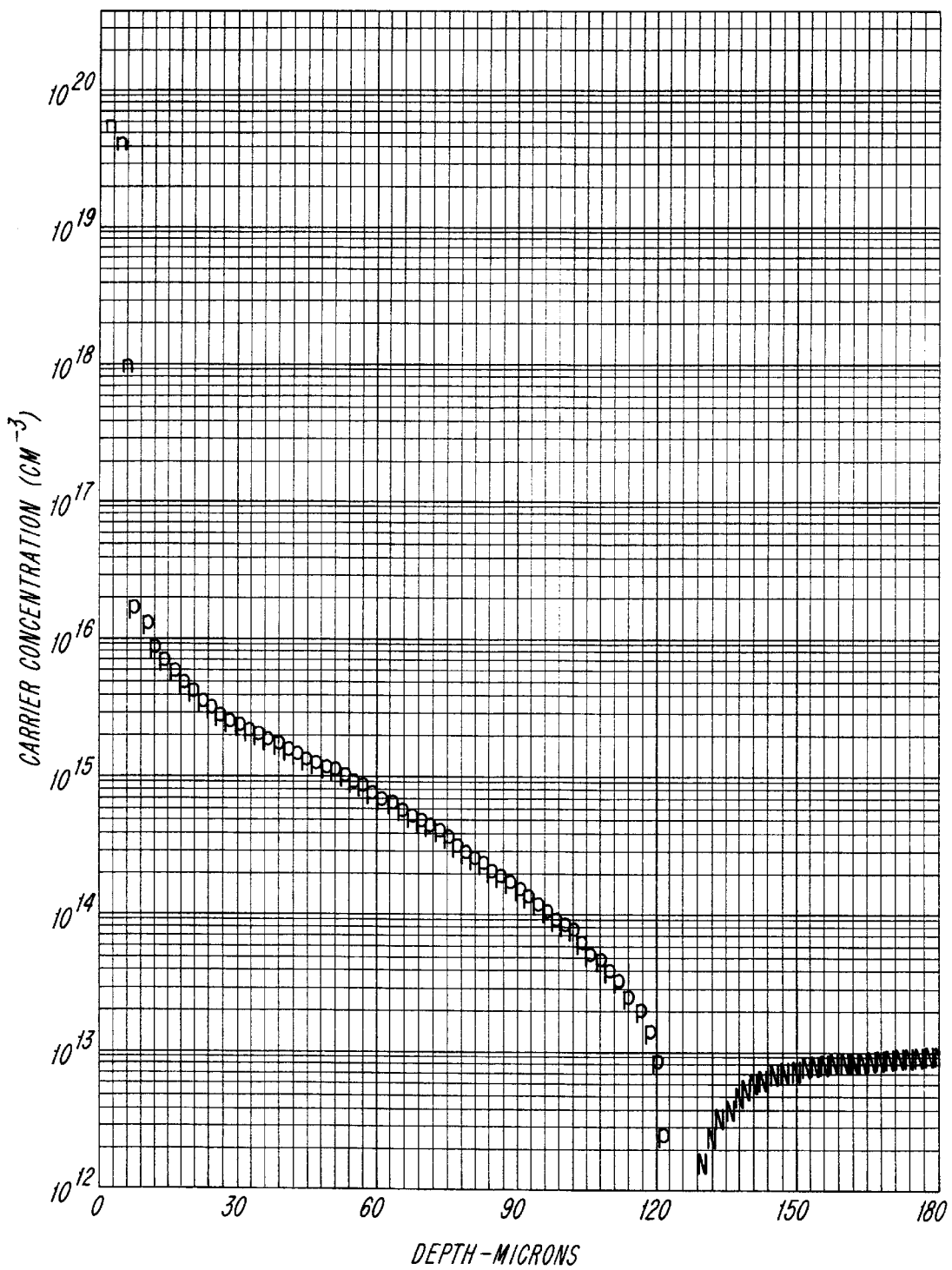
FIG. 13 is a continuation of the PPT cathode carrier concentration profile of FIG. 12.

Exemplary embodiments of the present invention can utilize, for example, either diffusion or microwave oven dopant drive technology. The microwave technique can be implemented, for example, by replacing a standard fixed frequency magnetron with a variable frequency TWT (Traveling Wave Tube). This technique is favored since the TWT allows uniform RF heating of the Si, without heating the surrounding environment, thereby significantly reducing probability of contamination. This is a considerable advancement over current diffusion oven techniques since diffusion temperature can now approach Si melting temperature. Diffusion oven techniques are notably limited since quartz holding tubes used during the diffusion process are prone to sagging and devitrification at temperatures above 1200° C. The resulting pnp structure is then one side lapped to a p concentration on the order of 10E17. The wafer is then diffused with phosphorous, on both sides, to a depth of about, for example, 6.5 microns to form a npnpn structure as illustrated in FIG. 12. The anode n side is then removed forming the raw npnp wafer. FIGS. 11–13 illustrate the complete profile which is capable of blocking, for example, >5 kV.

Figure 14:
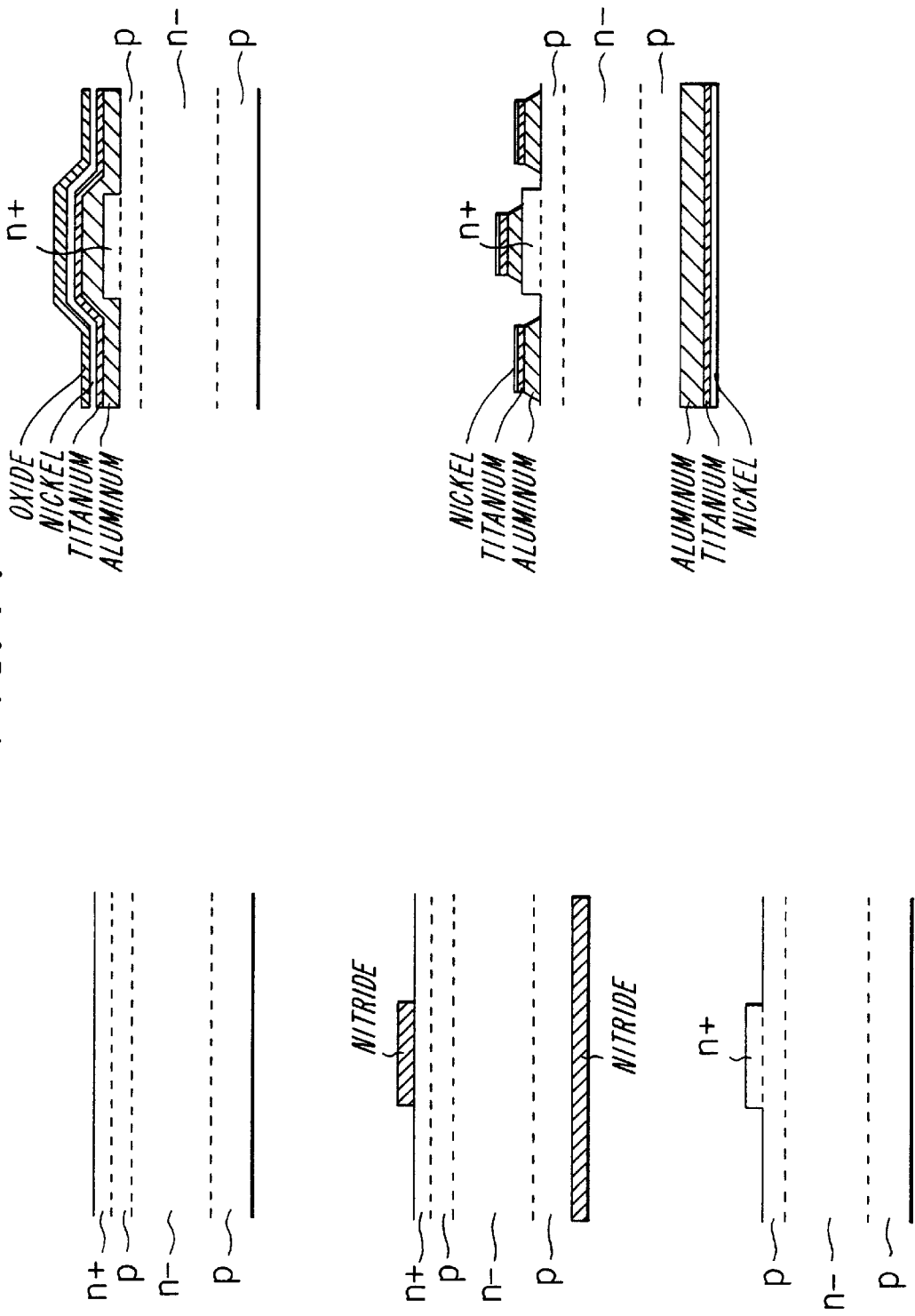
FIG. 14 provides a summary of an exemplary PPT (silicon) manufacturing process according to the present invention.

FIG. 14 illustrates an exemplary method of forming the Si surface, i.e., defining the emitter, through the metalization process. The starting Si substrate is made by the sequential diffusion of Al, Ga and B into a, for example, 450 Ohm-cm, 37 mil NTD doped n- water thereby forming a pnp. One side of the wafer is lapped, etched and n+ phosphorus (POCL3) is predeposited and annealed to form a n+ pnp n+ wafer. The anode side n+ is then removed by etching forming the n+ pnp structure.

FIG. 14 depicts a process that enables construction of a high voltage PPT type device that replaces planar diffusion fabrication methods, thus eliminating carrier lifetime reducing oxide mask/etch processes. That is, this process allows the thyristor to be etched, defined and metalized without any carrier lifetime reducing process steps, translating into lower on state (forward conduction) voltage. Although the FIG. 14 process depicts only one sided processing, exemplary embodiments of the present invention can be realized by applying the teachings of FIG. 14 to both sides of the wafer.

First, a low pressure chemical vapor deposited (LPCVD) nitride is deposited and patterned through use of standard photolithography masking techniques. Although FIG. 14 shows only one side being processed, the double sided shorting depicted in FIG. 9 can be obtained, for example, by applying the process shown in FIG. 14 to both sides of the wafer.

Figure 15:
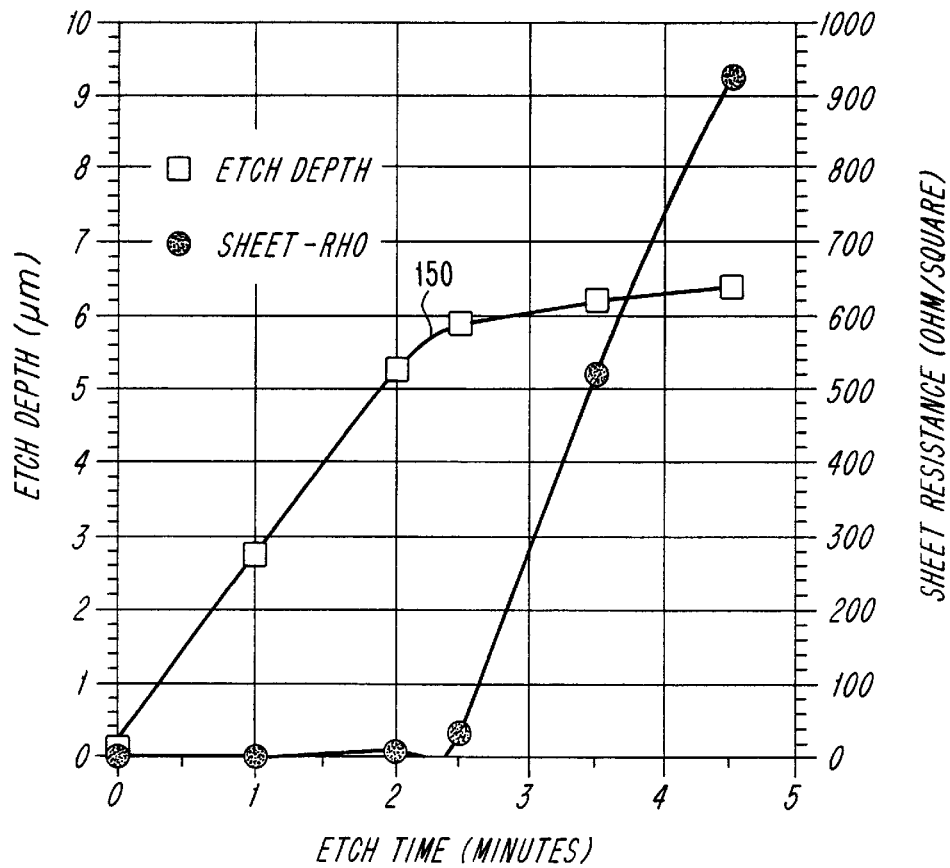
FIG. 15 illustrates (in sheet rho versus etch time) an exemplary process used to form the emitter structure according to the present invention.

The etch process described in Step 7 (FIG. 14) can be accomplished by utilizing the selective etch process depicted in FIG. 15, and results in an emitter step height on the order of, for example, about 7.5 microns. The N+ etch down procedure illustrated in FIG. 15, as opposed to the planar process used to produce conventional hockey puc devices (FIG. 8), renders the N+ (cathode) region fully exposed. This significantly increases optoelectronic qualities of device, while indirectly improving carrier lifetime. Since the N+ etch is a unique, selective etch, only N+ material is removed. The knee 150 on "square legend" curve of FIG. 15 illustrates the principle. That is, the etch down rate abruptly changes (slows down) when N+ material has been removed, exposing underlying P material. This provides excellent uniformity and control which in turn allow the fine geometrics and uniform electrical performance of exemplary PPTs. Since the etch is selective, an ($SiO_2$) oxide layer is not required to protect P material. The oxide layer used in fabrication of standard devices reduces carrier lifetime, increasing on state (forward conduction) voltage. Also shown in FIG. 15 is the increase in sheet resistance as the NP junction is approached.

Step 8 involves a non-selective Si etch that removes the remaining n material to allow reliable contact to the p gate region; followed by the removal of the nitride mask (9). Steps 10–21 involve the metalization process which is also used to alloy dope the gate regions for good ohmic contacts to the lightly doped gate regions. Al, Ti, and Ni are evaporated onto the emitter side and etch separated to obtain the gate-emitter lateral diode. Step 20 involves anode metalization using blanket Al-Ti-Ni. A result achieved using this process is to obtain good ohmic contacts to both lightly doped p Si (the gate region), the heavily doped P anode and the n+ cathode. God on-stage voltage is then achieved by alloying the Al into the Si with 500 C sinter step 21.

The foregoing describes how a high voltage, high di/dt and high temperature thyristor can be made compactly, relative to conventional hockey puc (phase control) type devices. Now an exemplary application of this device will be described.

Figure 16A:
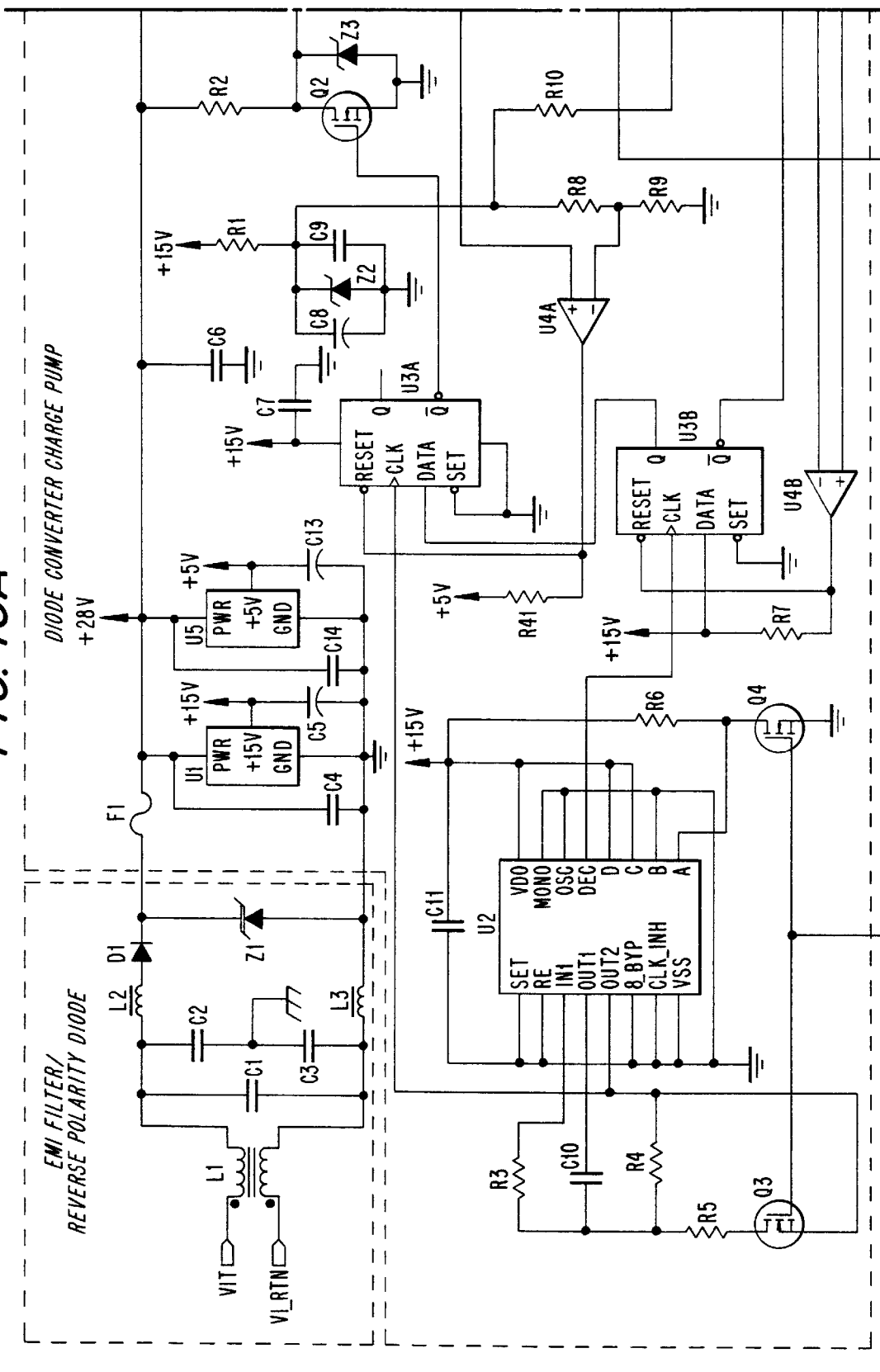
FIGS. 16A–16D contain an exciter schematic circuit diagram of an exemplary circuit embodiment, including PPT switching thyristor and feedback circuitry.

FIGS. 16A–16D illustrate a turbine engine ignition exciter circuit featuring the novel PPT switching device and automated feedback feature. For clarity, the circuit has been divided into four (4) major functional blocks: EMI filter, diode converter charge pump, energy storage and switching and diagnostic section. DC input power is applied between VIT and VI_RTN terminals. Power is then fed through the EMI input filter consisting of L1, C1, C2, C3, L2 and L3. The EMI filter is configured to reduce common mode noise as well as differential mode signals which are generated outside the exciter. The filter also filters noise signals generated within the exciter system, preventing both conducted and radiated emission outside of the exciter housing. In the case of radiated emission, the exciter is generally constructed such that either a separate metallic sub-enclosure, or PC board with considerable ground plane area is utilized to trap signals, preventing radiation. It should be noted the common/differential mode filter illustrated in FIG. 16A is just an example of one of a variety of viable circuit topologies which may be incorporated. Rectifier D1 serves as a reverse polarity protection diode which protects the exciter from inadvertent connection of the improper input voltage polarity between terminals VIT and VI_RTN. Z1 is a zener over voltage transient suppression diode. The zener diode is used to suppress voltage transients present on the input power cable, such as those induced during a lighting strike or aircraft/engine EEC switching. The zener may be replaced with a metal oxide varistor (MOV) or similar structure to accomplish this function, depending on specific program and design requirements.

Next, the diode converter charge pump will be described. F1 is a fuse designed to protect the DC source in the advent of a catastrophic failure, e.g. a short circuited switching FET (Q1) within the exciter. Other combinations of operational parameters can also cause fuse F1 to blow as described below with respect to FIGS. 17A–17C. Integrated circuits U1 and U5, in conjunction with corresponding filter capacitors C4, C5 and C14, C13 form linear voltage regulator networks which supply a highly regulated voltage, of appropriate potential to the CMOS and linear circuits within the exciter circuit. C6 is a high capacitance storage capacitor which forms part of the filter network and provides an energy reservoir to T1 thus reducing input current spikes and EMI noise. R1, C8, C9 and Z2 provide a stable reference voltage for the charge pump comparator U4A and tank voltage comparator U4B. U2 (Oscillator), R3, R4, (NPO capacitor) C10, R5, R6, Q3 and Q4 form an ultra stable oscillator which establishes the charge pump oscillating frequency and determines the spark rate of the exciter. The IC oscillator frequency is controlled by R4, R5 and C10. Values are selected to achieve maximum switching frequency to reduce component size.

The IC contains "divide-by-n" circuitry which allows stable high frequency oscillator frequency to be divided, establishing exciter spark rate frequency. It will be appreciated that this method ensures extremely stable spark rate frequency over entire input voltage and environmental operating envelope. Transistors Q3 and Q4, which are controlled by the diagnostic feedback circuitry, adjust the oscillator frequency allowing momentary transition into a burst mode (high frequency spark rate), when igniter plug quench condition is detected. U3A (Flip-Flop), Q2, U4A (Comparator) and R41 form the heart of the charge pump circuit. U2 provides a (spark rate frequency) clock signal to U3B which in turn activates U3A, turning on the charge pump at the (high frequency oscillator) clock rate set in U2. The $\overline{Q}$ output of U3A turns Q2 "off", thus activating Q1, ensuring proper (saturating) gate drive.

As Q1 is activated, current begins to increase linearly through power transformer T1 until the voltage across R12

(sense resistor) reaches the comparator U4A reference voltage as determined by voltage divider R8, R9. When the comparator U4A triggers, U3A is reset turning off Q1 via Q2, thus establishing a current mode feedback control loop. This process continues in response to consecutive U2 (high frequency) clock pulses until U4B, the voltage mode comparator, resets the spark rate control "Flip-Flop" U3A.

For clarity R41 and R7 are "pull-up" resistors for the "open collector" comparators outputs of U3A and U3B. R2 is an active pull-up for Q2 which provides drive to Q1. Z3 is a zener, which limits Q1 gate voltage to a safe value. Power transformer T1 is configured in a flyback configuration to minimize reflected load impedance and allow maximum output voltage over a widely varying input voltage range. Transformer T1 contains a tertiary, or feedback, winding to fully isolate the (voltage) feedback loop signal level electronics from high voltage present on secondary (tank capacitor) winding. When U3A causes Q1 to open (via Q2), the magnetic field contained in the core of T1 collapses. Due to phase relationship of T1 windings and orientation of D2, energy stored in T1 is subsequently imparted on tank capacitor C15. As charge incrementally accumulates on the tank capacitor, its voltage increases.

Dual FET's (Q1/Q2) can be used to prevent main switching FET Q1 from operating in linear region at low (exciter) input voltages. At low voltages, CMOS driver (U3A) may not supply sufficient gate drive (voltage) to fully activate Q1. Therefore, Q2 can be used in a quasi-darlington configuration to ensure maximum Q1 gate drive (di/dt). Z3 zener diode is used to protect Q2 drain-source junction during T1 flyback; clamp Q1 gate drive to save level.

Tank capacitor C15 is charged to the appropriate voltage (e.g., between 2–5 kV), through indirect action of the tertiary (feedback) winding on T1. The network comprised of diode D4, R14, R15, R16 and C16, C17 produces a stable (filtered) waveform which mirrors voltage present on C15. When voltage on tertiary (feedback) circuit reaches set point of U4B (comparator), the comparator output toggles, resetting U3B (Flip Flop), turning off the charge pump (through U3A). Simultaneously, U3B (Flip Flop) activates Q5. Energy stored in C17 is then discharged through trigger transformer T2, Q5 to ground. Trigger transformer T2 generates a high voltage/current pulse which triggers the PPT (Pulse Power Thyristor) allowing energy stored in tank capacitor C15 to flow through PFN to the igniter plug load. Diode D5 serves as a recirculation diode for T7, protecting Q5 from induced (back) EMF.

For purposes of illustration only, a simple air core inductive output L4 is depicted. However, those skilled in the art will appreciate that any of the output PFN (Pulse Forming networks) deemed in FIG. 5 (including air core, simple inductive, L-C peaking and transformer-capacitor pulse networks) may be used reliably, over the entire exciter operating envelope without limitation due to the unique high voltage, di/dt capability of the PPT. Other PFNs can also be used; for example, the impulse generator described below with respect to FIG. 20.

Energy delivered to output inductor L4 is then delivered to the mating ignition lead and igniter plug load (not illustrated). The simple air core inductor L4, in this case, is used to adjust spark plasma discharge duration and peak power. This feature allows the exciter output to be precisely matched (tuned) to specific engine requirements and achieve maximum ignition performance. This is a significant advancement over conventional solid state exciter technology which must intentionally maximize exciter output duration, to minimize di/dt stress experienced by phase control type thyristor switching devices.

As energy begins to dissipate in the (igniter plug) load, D6, the unipolarity, or commutating diode provides a return path for discharge current. This diode causes current to recirculate through the load, D6 and L4 until energy is completely expended. Back bias diode D3 provides a shunt path across the PPT for reverse currents generated immediately following PPT conduction, thus protecting the PPT when it enters the reverse recovery mode. Leads to diode D3 are illustrated in hidden lines since back bias diode D3 can be made integral to the PPT as shown in FIG. 10. Resistors R17 and R18 form a voltage divider which samples a portion of the output voltage and supplies it to the diagnostic circuit 166 for processing. Capacitors C18 and C19 block the high voltage dc present in the tank circuit, isolating sensitive "front end" processing circuitry form high voltage dc, allowing only the AC dynamic content to pass. Resistor R13 is a safety resistor which discharges C15 following removal of input power.

Diagnostic signal processing is accomplished as follows. Signal input derived from the R17, R18 C18, C19 AC voltage divider circuit is applied to the diagnostic inputs of (comparators) U13A and U13B. Both comparators are set to measure the minimum output voltage of the exciter. U9, the diagnostic master clock (oscillator), provides one-shot timers U10 and U11 basic timing information for pulse duration and spark rate, respectively. One-shot U10 measures the time the exciter's output voltage waveform is above the comparator U1 minimum set point, established by resistors R34 and R35. When the exciter fires, the output voltage amplitude will quickly diminish to the igniter spark plasma sustaining voltage (e.g., ≈50 V ) within several microseconds if the igniter plug is not quenched.

By contrast, when the igniter plug is quenched, output voltage will remain high, nearly equivalent to tank voltage for many milliseconds. Due to the vast (several orders of magnitude) difference in discharge voltage waveform, igniter plug quench condition is easily deduced. Therefore, U10 which is configured as a time out timer, generates a logic 1 output in response to the detection of a quenched igniter or an open circuit (lead). This logic 1 (from U10) is sent to U8A and U8B. U8A is configured as a retriggerable "one shot" providing a fixed output pulse to U12, a digitally controlled potentiometer. Each time U12 receives a pulse for U8A, the potentiometer value is incremented (one step). The U12 potentiometer forms half of the tank capacitor comparator (U4B) set point voltage divider network. Consequently, each time the potentiometer is incremented, the tank capacitor voltage is increased. Increased stored energy increases probability of igniter firing. Increased exciter tank voltage causes stored energy to increase through $E=\frac{1}{2}CV^2$. Each time the igniter fails to "fire" exciter output voltage and energy are incrementally increased.

During plug quench, U10 simultaneously supplies the (same) logic 1 signal to U8B. Like U8A, U8B is also configured as a retriggerable "one-shot". Based on component values of R26 and C29, U8B output pulse duration can be "programmed".

When U8B output goes high (Logic 1), the exciter charge pump (DC-DC converter) enters a "burst mode", which causes the exciter to transition from a low steady state, maintenance spark rate mode to a high spark rate burst mode. The combined effects of increased spark rate, ionization voltage and delivered energy are intended to overcome plug wear and fouling. If the igniter plug fails to fire following each exciter discharge, tank voltage and stored energy are incrementally increased to the limit of U12. Likewise, depending on the "time out" value (determined by R26 and C29), exciter charge pump will remain in high spark rate mode, as controlled by U8B, until the plug fires.

When the plug fires, U8B is reset, returning exciter to maintenance (steady state) low spark rate mode. U7 is a counter which keeps track of the digital potentiometer U12 "position". If the igniter does not fire after the digital potentiometer, U12 has increased exciter output to maximum voltage/energy, U7 generates a logic 1 output which is supplied to U6B input. U6B is configured as a latch. When logic 1 is received from U6B, output latches causing FET Q3 to close, tying the "Fail Igniter" line to ground. The Fail Igniter line is subsequently read by an engine EEC or similar device to determine whether a quenched igniter or open circuit ignition system fault exists. Exciter output voltage and spark rate analysis is accomplished by action of comparator U13B and subsequent circuitry.

Output of U13B toggles each time exciter discharge occurs and exciter output voltage signal provided by output AC divider circuit (R17, R18, C18 and C19) exceeds the U13B setpoint value. This setpoint value is determined by resistor divider network comprised of R37 and R38. The network comprised of U13B, U11, U6A and associated support circuitry determines exciter output voltage and spark rate are within threshold limits. When U11, which is configured as a "time-out" timer, fails to receive a reset pulse from U13B before the (spark rate) time out is reached, a logic 1 output is generated, indicating low exciter spark rate. The logic 1 signal is subsequently sent to U6A, which is configured as a latch. U6A then causes Q7 to tie the "Exciter Fail" line to ground providing an EEC or similar system analysis circuitry with an indication that annunciation exciter (low spark rate) fault has occurred.

Similarly, when an input signal provided by exciter AC coupled divider network fails to exceed the U13B setpoint value, U11 again times out, providing logic 1 to U6A. In this case, the "Exciter Fault" line is again pulled low by Q7, indicating an exciter (low output voltage) fault.

Circuitry comprised of FET Q8, R24, R25 and C28 provides a reset signal to U6 (A and B) when power is applied to the diagnostic circuit, resetting the diagnostic function. The circuit comprised of FET Q9 R29, R30, R31, R32 and C35 generates a "write" timing signal to U12 digital potentiometer. This "write" signal causes U12 to write the potentiometer setting to internal EEPROM circuitry, allowing the exciter to retain current output voltage and energy settings following removal of input power. By retaining settings, exciter output continually adjusts to changing engine and igniter plug wear conditions. The combined effects of the automated feedback and diagnostics reporting circuitry allow exciter to automatically compensate for changing engine and system wear variables, advising the pilot or EEC system of system wear, and subsequent corrective action, extending useful life of the ignition prior to actual system fault and "catastrophic" failure reporting.

Figure 17A:
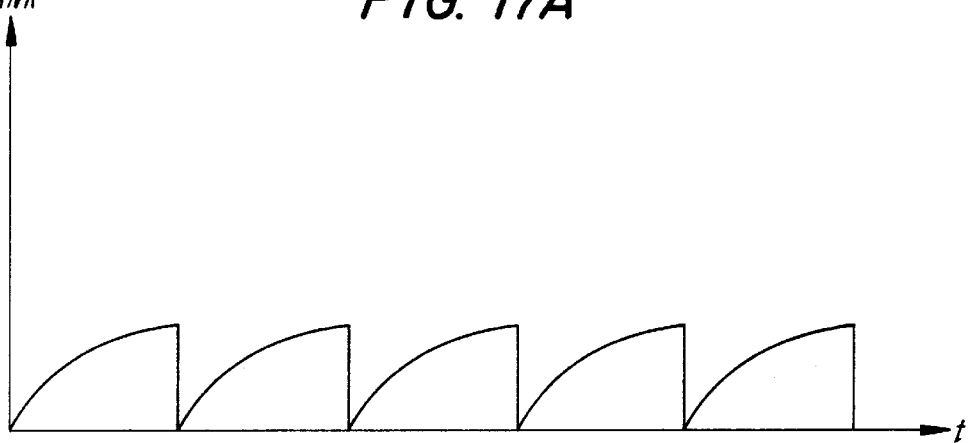
FIG. 17A is a graph illustrating conventional storage device charging time.
Figure 17B:
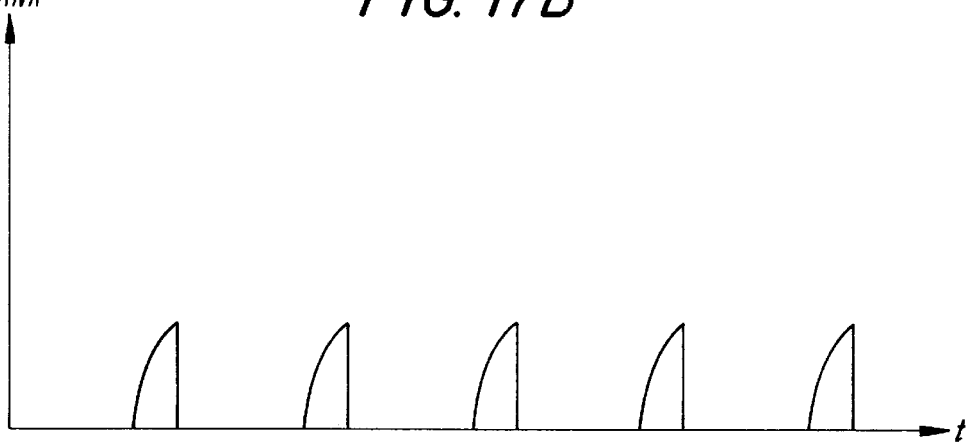
FIG. 17B is a graph illustrating storage device charging times according to the present invention under a first set of conditions.
Figure 17C:
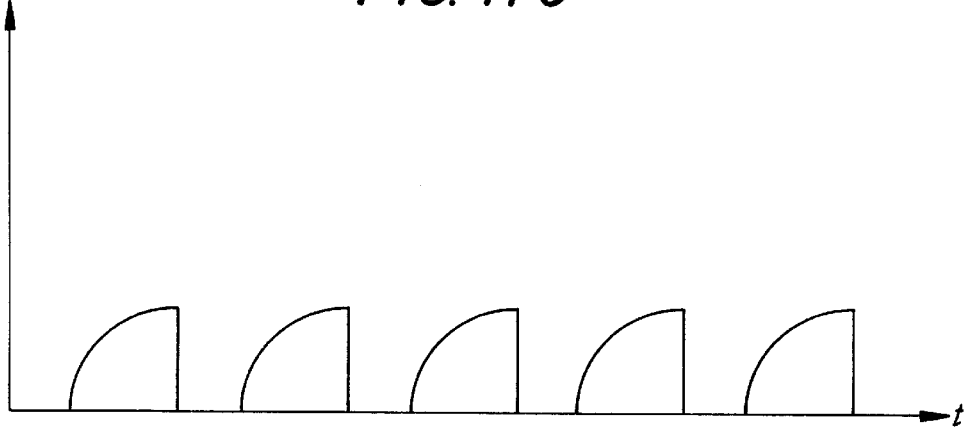
FIG. 17C is a graph illustrating storage device charging times according to the present invention under a second set of conditions.

According to exemplary embodiments of the present invention, charge and discharge cycles have been optimized to reduce stress on the PPT 6. For example, by charging and discharging the storage capacitor relatively rapidly, the PPT 6 need block the stored voltage for less time, thereby placing less stress on the semiconductor switch. This concept is illustrated by the graphs of FIG. 17A–C wherein the graph of FIG. 17A illustrates conventional charging techniques which typically charge an energy storage device over a relatively long period of time. By way of contrast, systems according to the present invention charge the energy storage device in significantly shorter periods of time as illustrated in the graphs of FIGS. 17B and 17C.

Unfortunately, there may be various conditions which necessitate an increased charge time. This situation is graphically portrayed by the longer charging times of FIG. 17C relative to FIG. 17B. For example, as temperature increases, leakage through the PPT 6 also increases which dissipates power and increases the charge time for energy storage device 3. Another factor which can lead to increased charging time is if the voltage input to the exciter circuitry is reduced. For example, there may be period of time, e.g., at startup or when the battery supplying power to the system is low, when the actual voltage input to the exciter circuitry may be much lower than the nominal rating of that voltage. For example, the graph of FIG. 17B may represent charging times at 25° C. with the battery supplying 28 Vdc, while the graph of FIG. 17C may represent charging times for the same circuit operating at an ambient temperature of 121° C. with the battery supplying 9 ½ volts. In a constant power application, as the input voltage is decreased, the input current will increase along with the charging time for the storage capacitor due to $I^2/R$ losses. This has several implications. For example, the fuse F1 illustrated in FIG. 16A which protects a circuit may blow if the input current increases beyond that at which the fuse is rated. Moreover, if the input voltage is low for a sufficiently long period of time, then the increased charging time may lead to a thermal runaway (breakdown) of the PPT 6.

In order to avoid the adverse consequences associated with lower than normal input voltage, Applicants have developed a low voltage lockout feature which prevents the circuit from operating when the input voltage is lower than a predetermined threshold. The predetermined threshold can be selected to be any voltage level which is less than a desired operating input voltage depending upon various design considerations. For example, for a nominal input voltage rating of 28 volts, a threshold of 9 ½ volts can be selected whereupon the circuitry will not operate if the input voltage drops below 9 ½ volts. An exemplary implementation of this low voltage lockout feature will now be described with respect to FIG. 17D.

Figure 17D:
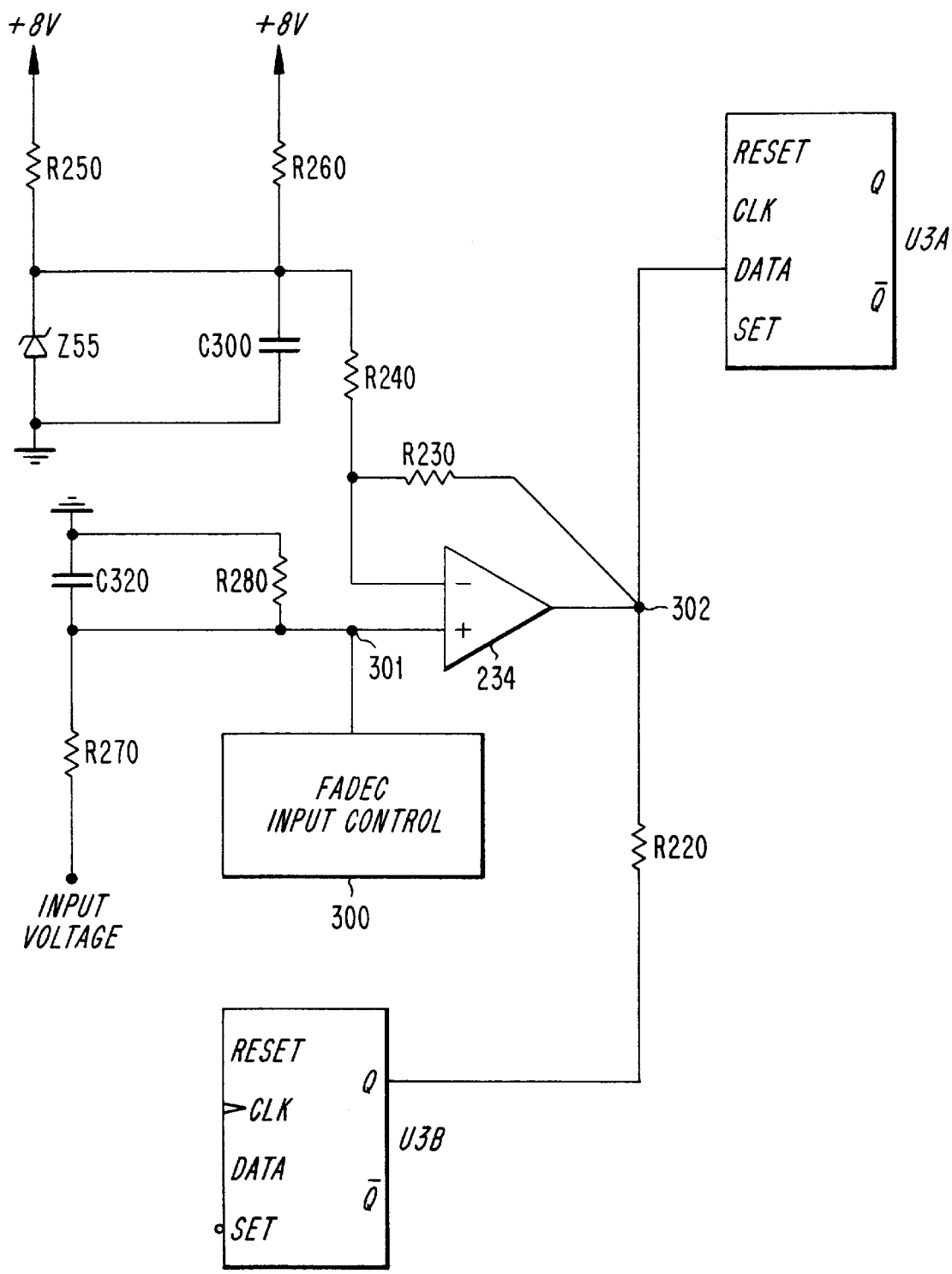
FIG. 17D is a modified portion of FIG. 16A used to describe an exemplary embodiment of low voltage lockout circuitry according to the present invention.

In FIG. 17D, the input voltage is monitored by comparator 234 through a voltage divider comprised of resistors R270 and R280 and filtered by capacitor C320. A stable voltage reference is established by bias resistors R250 and R260, zener diode Z55 and filtered by capacitor C300. This voltage reference is then input to the inverting terminal of comparator 234. Resistors R240 and R230 provide a comparator hysteresis (e.g., approximately 0.3 V) which prevents oscillatory operation when the input voltage has a value which is approximately similar to that of the reference voltage applied at the inverting terminal of comparator 234. When the input voltage applied at the non-inverting terminal of comparator 234 is less than that of the threshold voltage, then the Q output of flip-flop U3B through resistor R220 is shorted and the current mode feedback loop controlled by flip-flop U3A of the charge pump is prevented from operating.

Thus, when the input voltage is below specified limits, exciter operation is inhibited because the primary (current mode) control loop is deactivated. This prevents the charge pump from imparting charge (voltage) on the exciter tank capacitor. In this way, the above-described problems that occur when input voltage droops and charge time increases are eliminated. In addition to restricting the operation of exciter circuits when the input voltage drops below a threshold, other exemplary embodiments provide a technique for activating and deactivating the exciter circuitry by way of an additional signalling circuit illustrated in FIG. 17D as FADEC input control block 300. This feature will now be described with respect to FIGS. 17E and 17F.

Traditional exciters are activated and deactivated through application or removal, respectively, of input power to the system. That is, with reference to FIG. 17B, to conventionally activate or deactivate the circuit the input voltage would be selectively applied. However, this technique requires bulky, high-gauge wiring between, for example, an aircraft's power bus and control switching circuitry. With the advent of full authority digital engine control (FADEC) computers, air frame wiring becomes excessive since it is desirable for the FADEC to provide power to the exciter in addition to the traditional cockpit override wiring. To eliminate this inefficiency, exemplary embodiments of the present invention introduce a direct FADEC input control feature as generically illustrated by block 300. According to this technique, the exciter is constantly provided with an input voltage, i.e., the exciter is hard-wired to the aircraft DC power bus with no switches between the exciter and the bus. Instead, activation and deactivation of the circuitry is achieved through relatively small gauge wiring linking the FADEC to, for example, the low voltage lockout circuitry illustrated in FIG. 17D. Two exemplary embodiments of FADEC input control block 300 will now be described with respect to FIGS. 17E and F, respectively.

Figure 17E:
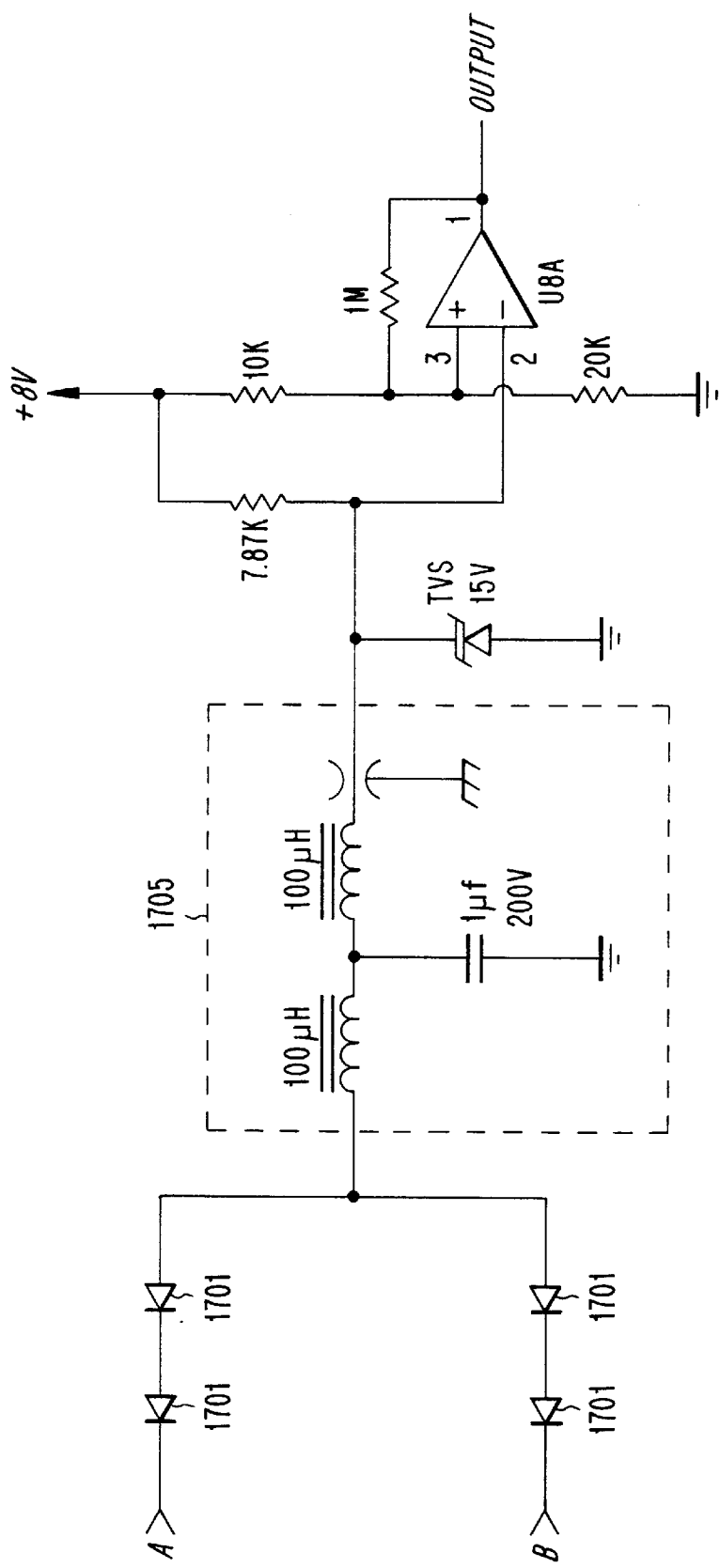
FIGS. 17E and 17F illustrate two exemplary embodiments of FADEC input control circuit according to exemplary embodiments of the present invention.

In FIG. 17E two FADEC channels A and B are illustrated at the left hand side of the figure. By providing two channels for controlling the exciter, a redundancy is built in should one of the channels fail. Several high voltage diodes 1701 are included to provide a diode "OR" function which allows activation of the exciter by turning on either the A or B FADEC control channel. Thus, if only one of the redundant channels turns on, this will still be sufficient to allow the exciter to operate. Following the diode "OR" function is a typical T filter arrangement including two inductors, a feed-through capacitor and a transorb (MOV). These components, enclosed by the dotted box 1705, provide one example of an EMI/voltage transient or lightning protection circuitry. However, those skilled in the art will recognize that a variety of different types of networks could be substituted for the components illustrated in block 1705 to protect the sensitive control circuitry from externally induced transients. FADEC activation causes current to flow from the 8 volt supply bus through the 7.87 kΩ resistor. This drives the inverting input of comparator U8A below the threshold voltage established by the 10 kΩ and 20 kΩ resistive divider network attached to the non-inverting comparator input. The 1 MΩ resistor provides hysteresis in case the reference voltage and applied control voltage should be similar. When either channel A or B are active, the output of comparator U8A floats the non-inverting input of comparator 234 in FIG. 17D low, thereby allowing input voltage information to be processed by comparator 234. Lack of FADEC input, on the other hand, causes the output of comparator U8A in FIG. 17C to tie the non-inverting input of comparator 234 in FIG. 17D low, thereby inhibiting the processing of input voltage information and turning the exciter off. The exemplary embodiment illustrated in FIG. 17E describes various component values which, of course, are simply illustrative in nature and may be varied to accommodate, for example, different voltages and other design parameters.

Figure 17F:
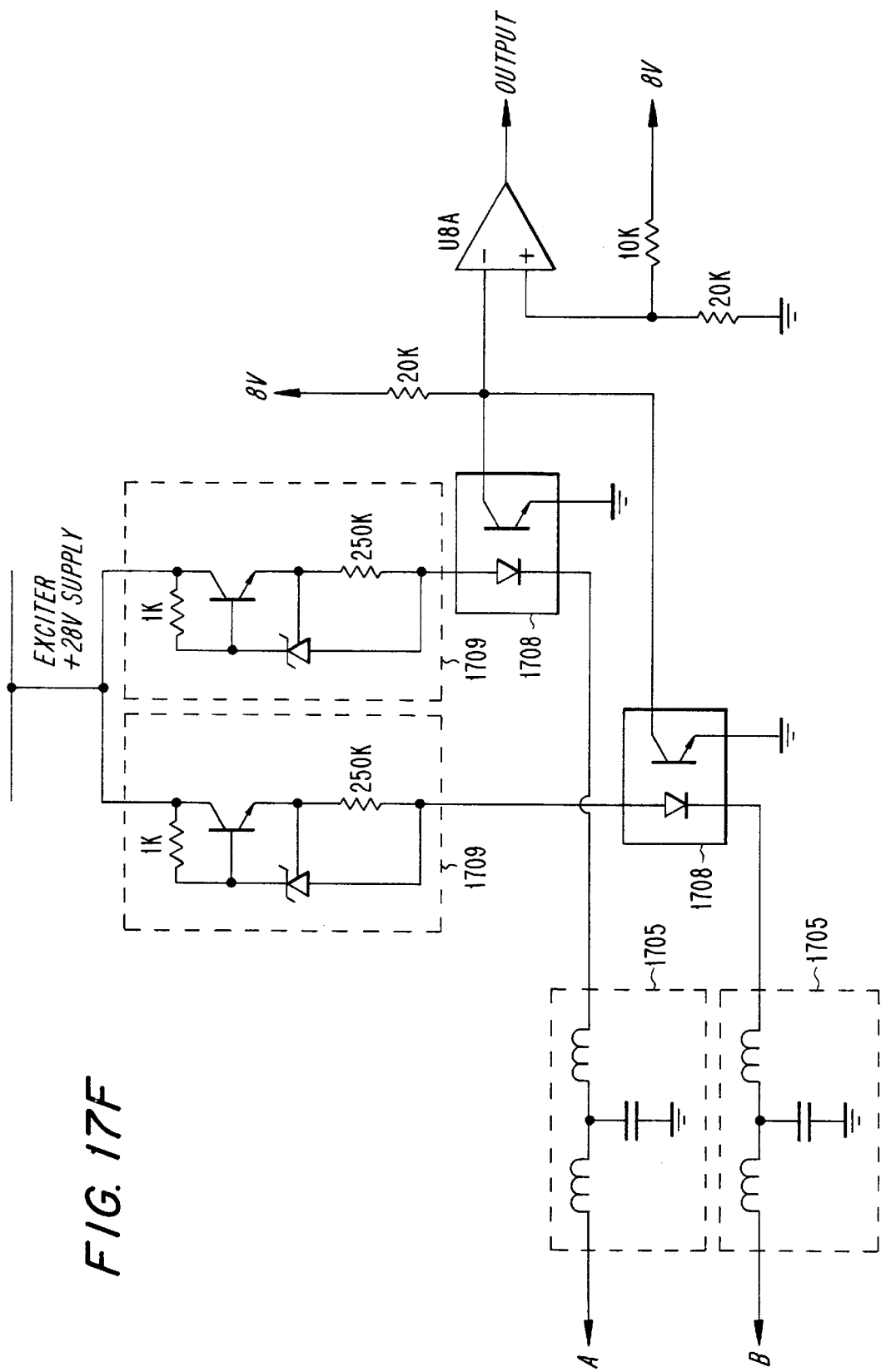

FIG. 17F provides an alternative exemplary embodiment for FADEC input control block 300. In this approach, opto-isolators are utilized to provide complete electrical isolation between the signal processing circuitry, the FADEC, and each FADEC channel. As with the exemplary embodiment of FIG. 17E, protection against transients is provided by the EMI filters 1705. Each channel A and B also has an opto-isolator 1708. However, those skilled in the art will recognize that a single EMI filter 1705 and a single opto-isolator 1708 could be employed to service both channels A and B if a diode "OR" circuit was provided upstream of these elements as, for example, illustrated in FIG. 17E. For each channel, a constant current source 1709 is provided to establish constant current to each opto-isolator 1708. As with the previous embodiment described in conjunction with FIG. 17E, the opto-isolator transistors are used to tie the inverting input of comparator U8A low when the exciter is to be activated by the FADEC. In the illustrated embodiment of FIG. 17F, the biasing of comparator U8A is relative to the exciter's internal 8-volt regulated bus. By contrast, the opto-isolators 1708 are referenced to the 28-volt DC airframe bus to prevent excess loading of the regulated 8-volt exciter bus at high temperatures.

Although the foregoing exemplary embodiments of the FADEC input control feature have been described in conjunction with the low voltage lockout circuit of FIG. 17D, those skilled in the art will also appreciate that FADEC input control can be provided without low voltage lockout circuitry. For example, instead of ANDing the FADEC input control signal with the divided version of the input voltage at node 301 in FIG. 17B, the FADEC input control could instead be connected directly to node 302 to selectively short R220 without the low voltage lockout circuitry being present. As mentioned earlier, FADEC input control provides several advantages over conventional techniques which use a switching approach to providing the raw input voltage. For example, the large gauge wiring required in these conventional solutions and switching to the airframe bus are no longer necessary.

Figure 18:
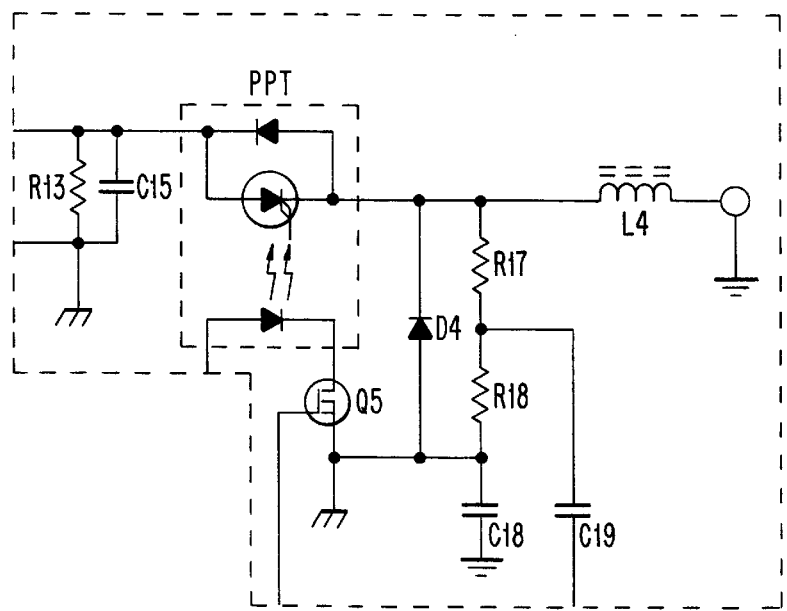
FIG. 18 presents an exemplary optoelectronically triggered embodiment of the present invention.
Figure 16B:
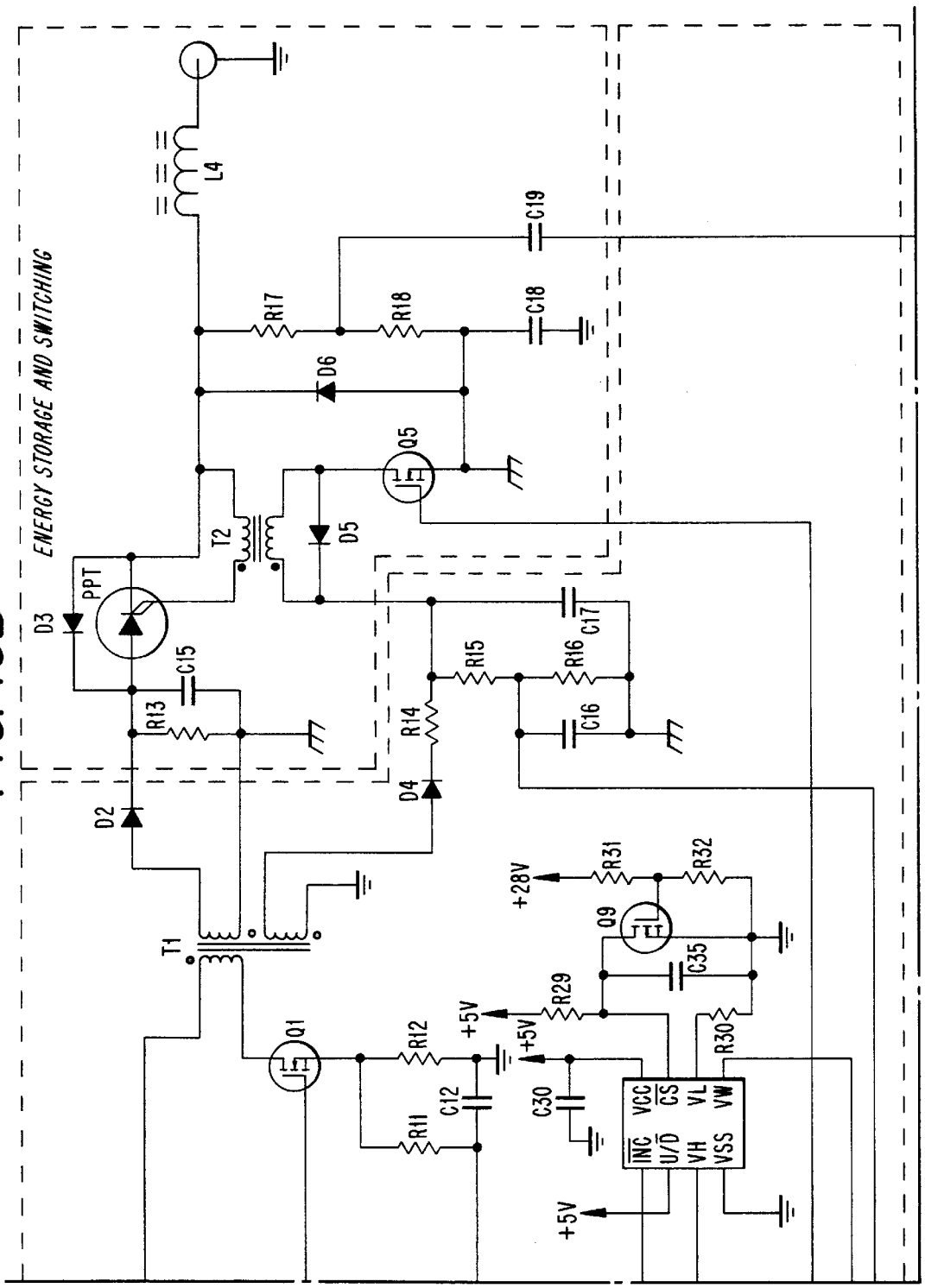
Figure 16C:
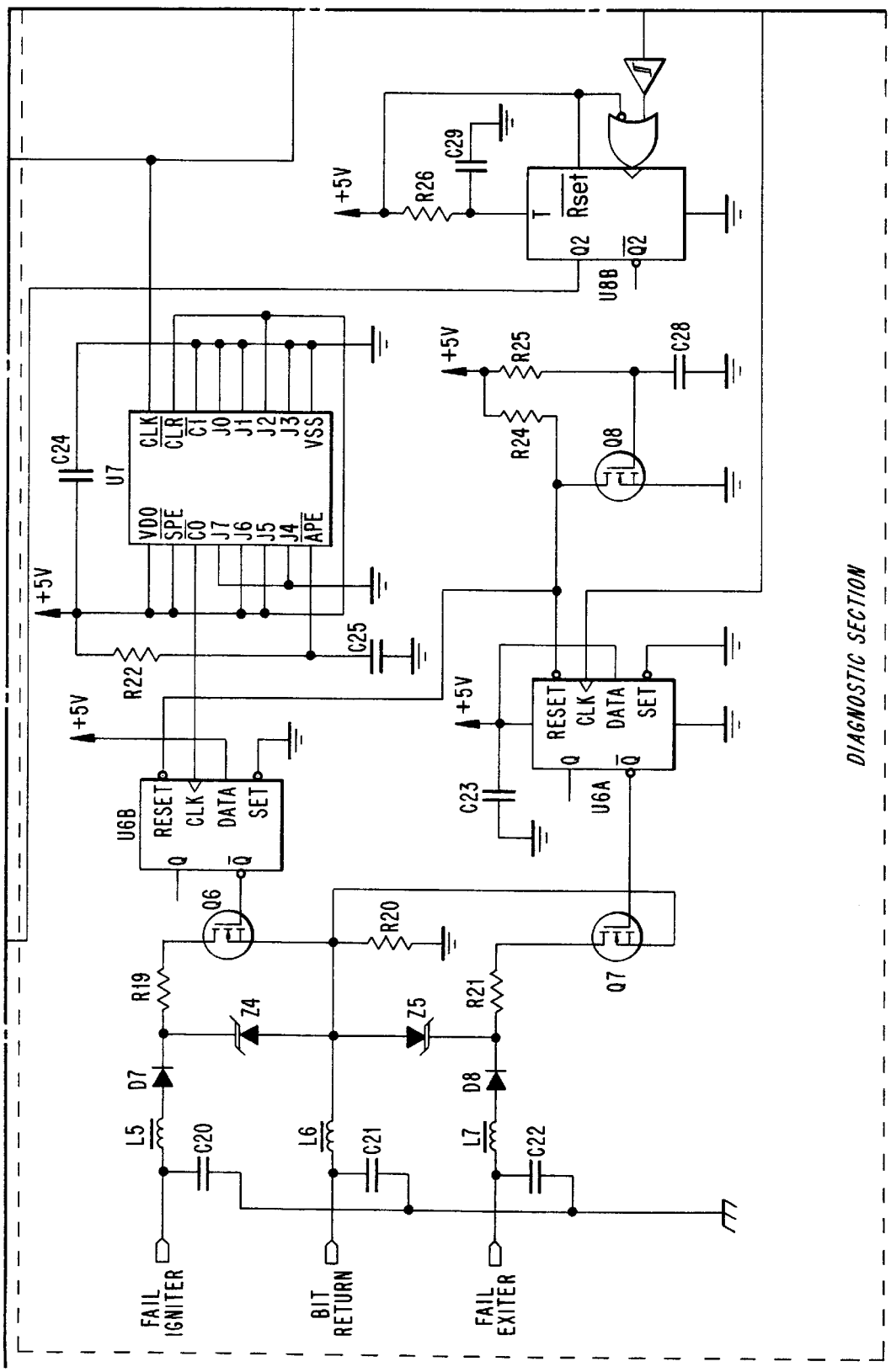
Figure 16D:
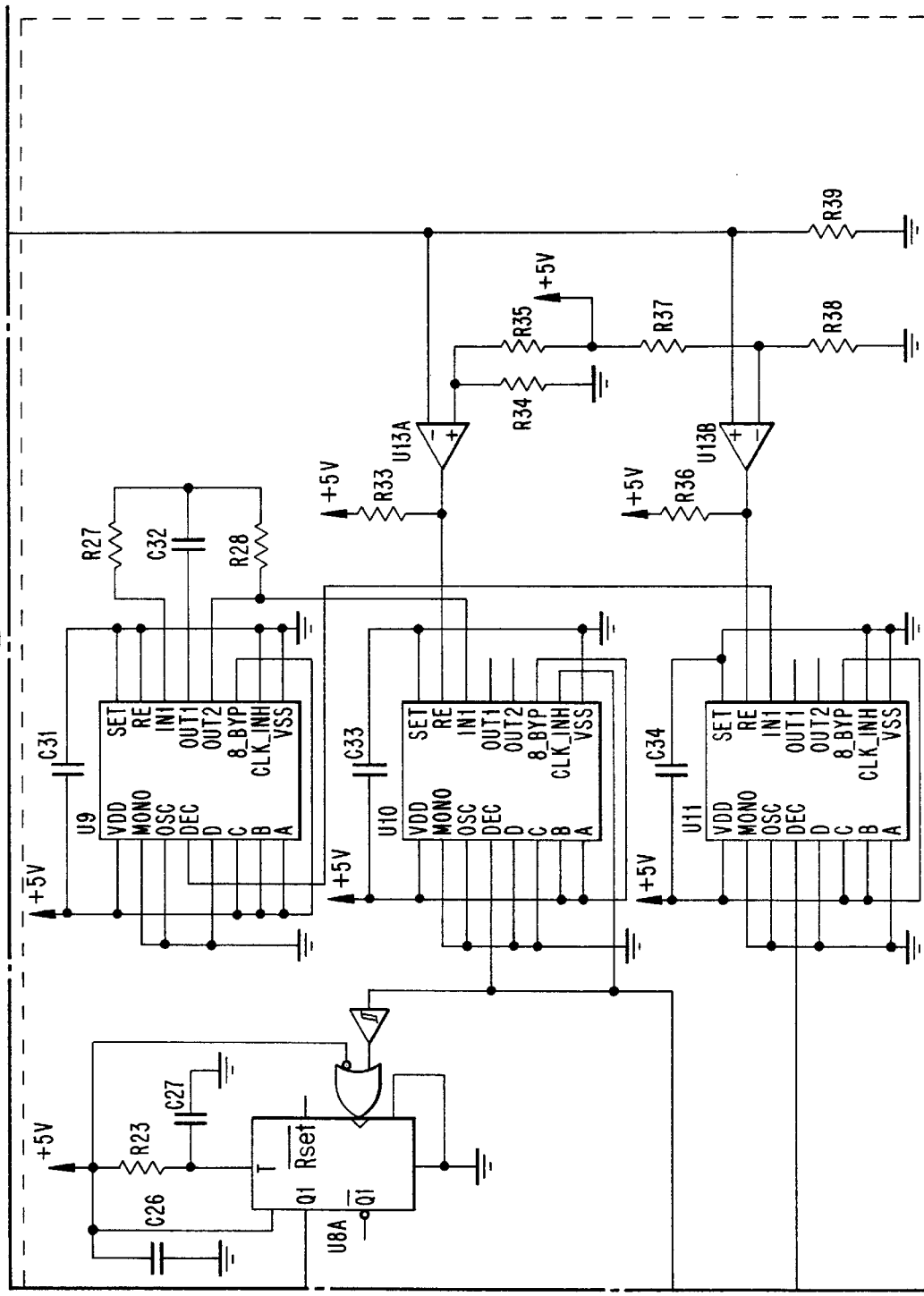

FIG. 18 illustrates an optical PPT triggering variation of the energy storage circuit described in FIG. 16B. Optical triggering can be used, for example, in applications where protection against the effects of electromagnetic pulses or pulse transformer failure is desired. In this exemplary embodiment, PPT trigger transformer T2 is replaced with an LED optoelectronic triggering device. The device in FIG. 17 (illustrated by hidden lines) is a hybrid circuit containing the PPT die, an LED optoelectronic triggering means and integral back bias diode (as described previously in FIG. 10). In this case, energy stored in C17 is delivered to LED when Q5 is activated by exciter spark rate control flip-flop U3B. An integral back bias diode eliminates the need for separate discrete back bias diode D3 illustrated in FIG. 16B. It will be appreciated that a variety of physical configurations and triggering devices can be utilized in the optoelectronic triggering case. Alternate fabrication methods can include alternate trigger source technologies, e.g. LASER. Likewise, the fabrication method can include either integral (on hybrid) LED/LASER triggering, or external triggering. In the latter case, an LED or LASER diode is housed in a separate package, and optically connected to suitable PPT (optical) package via fiberoptic cable.

Figure 19:
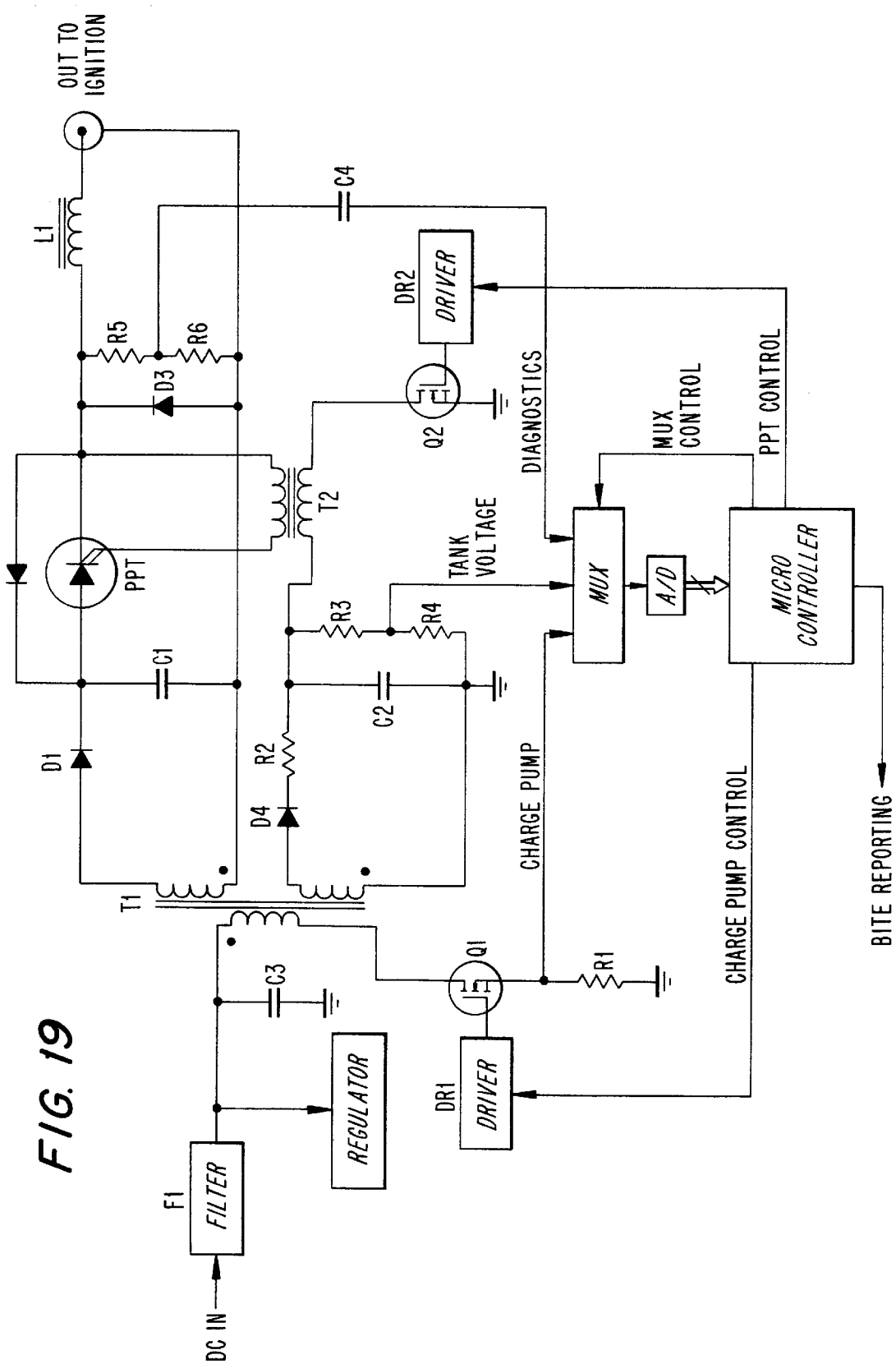
FIG. 19 illustrates an exemplary microprocessor/controller based embodiment.

Referring to FIG. 19, a microprocessor/controller circuit embodiment is described. DC power applied to the exciter input FILTER F1 is filtered to prevent entrance or escape of radiated and conducted noise emissions as with prior embodiments. Filtered power is applied to a stable voltage REGULATOR which provides regulated power to all subsequent (signal level) circuitry. The filter also supplies power to energy storage device C3 and (flyback) power transformer T1. Unlike prior exemplary embodiments, a microprocessor/controller controls all exciter energy management, feedback and diagnostic reporting functions. Exciter parameters, e.g., spark rate, output voltage, stored energy, diagnostic limits and feedback control loop setpoints can be readily changed through modification of software code contained within on board ROM (not shown), without modification of exciter physical circuitry. A variety of memory technologies including ROM, EPROM EEPROM and WORM may be utilized depending on program objectives. The microcontroller can include, for example, 8-bit or higher architecture. Peripheral devices and support circuitry will vary depending on the specific microcontroller being used. The exemplary circuitry illustrated in FIG. 19 is based on a 16-bit architecture, containing a 16-bit data bus, ALU and registers. A 20 MHz or higher microprocessor clock frequency can be used to ensure the microcontroller accurately resolves fast rise time transient events. Through use of an efficient instruction set and 20 MHz clock, the microprocessor can execute commands in approximately 200 ns. This time window allows extremely high resolution (and direct analysis) of pulse discharge events such as those generated during exciter discharge. The micro-controller can contain, for example, four 16-bit timers/counters with four synchronous outputs, eight vector interrupt sources and uses CMOS technology for low power consumption.

Data such as charge pump transformer primary current, tank capacitor voltage and discharge voltage waveform are all connected to a central multiplexer (MUX). The MUX, which is controlled directly by the microprocessor, supplies appropriate analog channel to the high speed analog-to-digital converter A/D for subsequent digitization. When power is applied to the circuit, the micro-controller begins acquiring date from the multiplexed data line. Voltage across the charge pump (current sense) resistor R1 is then routed to the high speed A/D, converted to a digital value and read by the micro-controller. During a subsequent microprocessor instruction, DRIVER DR1 is triggered which in turn activates main switching FET Q1. This initiates current flow through primary of power transformer T1. As current increases linearly through the primary winding, voltage drop across sense resistor R1 increases.

Throughout this process, the micro-controller is continually receiving multiplexed data from the MUX. When $V_{R1}$ reaches predetermined (software) setpoint value (during subsequent $V_{R1}$ read cycles) the micro-controller then removes drive (logic 1) level from DRIVER DR1 line. This causes transformer T1 to "flyback", releasing energy stored in the transformer core through D1 into the tank capacitor C1, and D4, R2 into energy "mirror"/trigger capacitor C2. Due to the tnansformer T1 winding phase relationship and orientation of diodes D1 and D4, the circuit is configured in a flyback topology, blocking current flow during switching FET Q1 conduction. Since D1 and D4 conduct together, the voltage on tank capacitor C1 is proportional to the voltage on "mirror"/trigger capacitor C2 in accordance with the transformer T1 turns ratio α. By using a separate "tertiary" winding on the transformer T1 secondary to supply a (tank capacitor) voltage mirror to C2, the high voltage/current output stage is electrically isolated from low voltage signal level logic and control circuitry.

The process of activating DRIVER DR1, reading sense resistor voltage ($V_{R1}$), and incrementally imparting charge on capacitors C1 and C2 continues during consecutive microprocessor instruction cycles. As the capacitor charge (voltage) increases, voltage across tank capacitor sense resistor R4 portion of R3, R4 resistive divider increases. During subsequent microprocessor read cycles, $V_{R4}$ eventually reaches predetermined (software) setpoint value indicating tank capacitor has reached full charge (stored energy).

This causes the microprocessor to deactivate DRIVER DR1 charge pump operation and activate DRIVER DR2, causing energy stored in "mirror"/trigger capacitor C2 through the pulse transformer T2. T2 now turns on the PPT thyristor switching device allowing energy stored in C1 to discharge through output PFN comprised of L1 to the mating ignition lead and igniter plug load. It will be appreciated from prior embodiments presented herein, the PPT may be triggered by an optoelectronic device. Likewise, a variety of PFN topologies may be substituted for L1 as described previously.

As energy is dissipated in the output PFN and igniter plug plasma, commutating diode D3 causes discharge current to recirculate, giving the output waveform characteristic unipolar shape. Back bias diode D2 provides a shunt path across PPT immediately following triggering, thus protecting the PPT from transient (reverse polarity) currents generated during the PPT reverse recovery (turning off) period. Resistors R5 and R6 form a voltage divider which provides a relatively small amplitude signal which mirrors exciter discharge output waveform. Signal is fed through a single dc blocking capacitor C4 to the MUX, A/D and finally to the microcontroller.

When the amplitude diagnostic signal from R5, R6 and C4 exceeds minimum (programmed) setpoint value a timer within the microprocessor is started. When the igniter discharges, the duration of diagnostic signal provided by R5, R6 and C4 is short (on the order of, for example, 20–200 μs) depending on specific exciter design. When the igniter is quenched (i.e., fails to discharge) the diagnostic signal time window is considerably longer (several orders of magnitude) due to the RC time constant of C1, R5 and R6. As the microprocessor timer continues measuring duration of the diagnostic signal, igniter/lead quench/open circuit is inferred once diagnostic signal duration exceeds microprocessor predetermined (time out) interval. Depending on the specific microprocessor control code, a variety of subsequent actions may be taken. For example, the microprocessor may increase the spark rate, output voltage/energy, report failure to EEC or similar communication device, or any combination of the above.

Following activation of the PPT and processing of diagnostic information, the microprocessor executes a preprogrammed "time out" cycle before repeating charge pump, discharge and diagnostic evaluation cycle, thus achieving constant exciter spark rate. This microprocessor based system is completely flexible, minimizing hardware and wiring changes necessary for various applications and mission profile changes since all exciter activities are software controlled.

Figure 20:
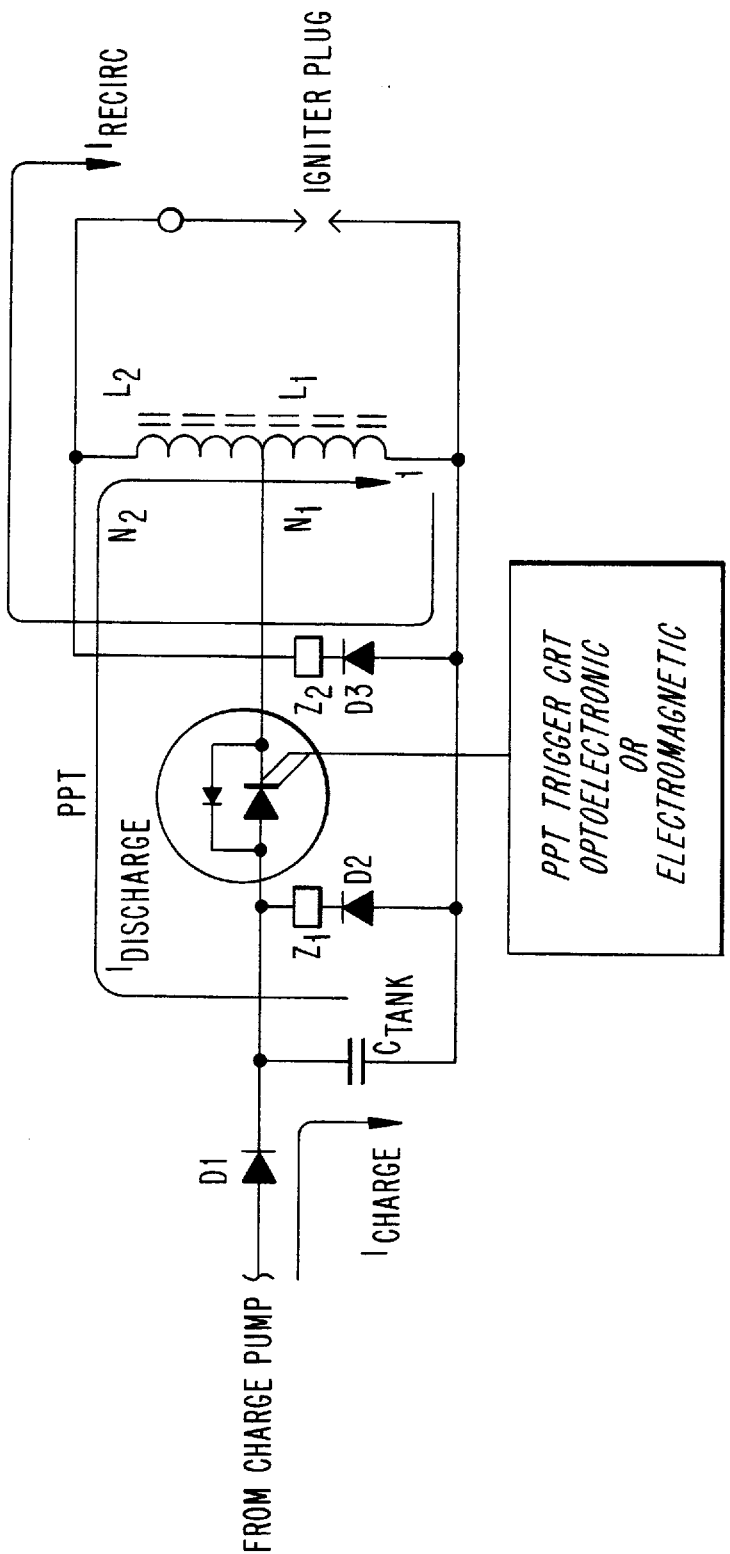
FIG. 20 illustrates an exemplary impulse generator which can be used as the output PFN of exciter circuits according to the present invention.

FIG. 20 illustrates an exemplary delta function, or impulse, generator. Unlike traditional ignition exciter transformer-capacitor PFN topologies, this circuit eliminates the trigger capacitor, enabling a impulse (delta function) output. Since the trigger capacitor charge time is eliminated, a true impulse, or step function output is achieved. It will be appreciated by those familiar with both conventional semiconductor (low voltage) and conventional air gap (high voltage) ignition systems, high dv/dt significantly improves ability of igniter plug to fire during quench conditions.

When the igniter plug becomes quenched, through extreme combustor pressure, or presence of water, carbon, fuel or other contaminants, the impulse voltage requirements increase. That is, the number of volt-seconds required for ionization increase. For example, a low tension semiconductor type igniter plug may require 3 kV for 3 $\mu$s to ionize under ambient conditions. At full combustor pressure, or when contaminated, the igniter may require 3 kV for 100 $\mu$s. Conversely, the igniter may be ionized by application of a 6 kV 50 $\mu$s pulse. By supplying a true impulse or step function input, igniter ionization is more precisely controlled. High dv/dt of the circuit minimizes time required to charge the igniter plug parasitic capacitance; increasing rate of charge (electric field strength) on the igniter electrodes. This exemplary impulse generator circuit is made possible by the practically unlimited di/dt capability of the PPT thyristor switching device.

A charge pump (not illustrated), provides energy through rectifier diode D1 to tank capacitor $C_{TANK}$, via $I_{CHARGE}$ PPT switching device is triggered (by either electromagnetic or optoelectronic means) when tank capacitor has reached full charge (energy). The PPT is illustrated here with an integral back bias diode although this diode need not be integral as discussed earlier. At the instant the PPT is activated, a unit step function of amplitude V, the tank capacitor voltage is imparted on air core output inductor (comprised of L1 and L2). Depending on the turns ratio of L1 to L2, an amplified voltage determined by the turns ratio N1/N2 is applied to the igniter plug, thereby forcing reliable ionization. When igniter plug ionization has occurred, current flow continues through L1 and L2. Exciter discharge waveform characteristics may be controlled by the output inductor turns ratio, and recovery time of diodes D2 and D3 and circuit damping can be controlled by impedances $Z_1$ and $Z_2$.

After igniter ionization, current loops $I_1$ and $I_2$ deliver energy to the igniter and $L_1$, $L_2$, respectively. Later in the cycle, inductive energy remaining in $L_1$ and $L_2$, is delivered to the igniter via $I_3$ and $Z_1$, $Z_2$ via $I_4$ and $I_5$. $Z_1$ and $Z_2$ are used to control the shape of the I, V igniter waveforms, and to assure complete discharge of the tank capacitor.

Figure 21:
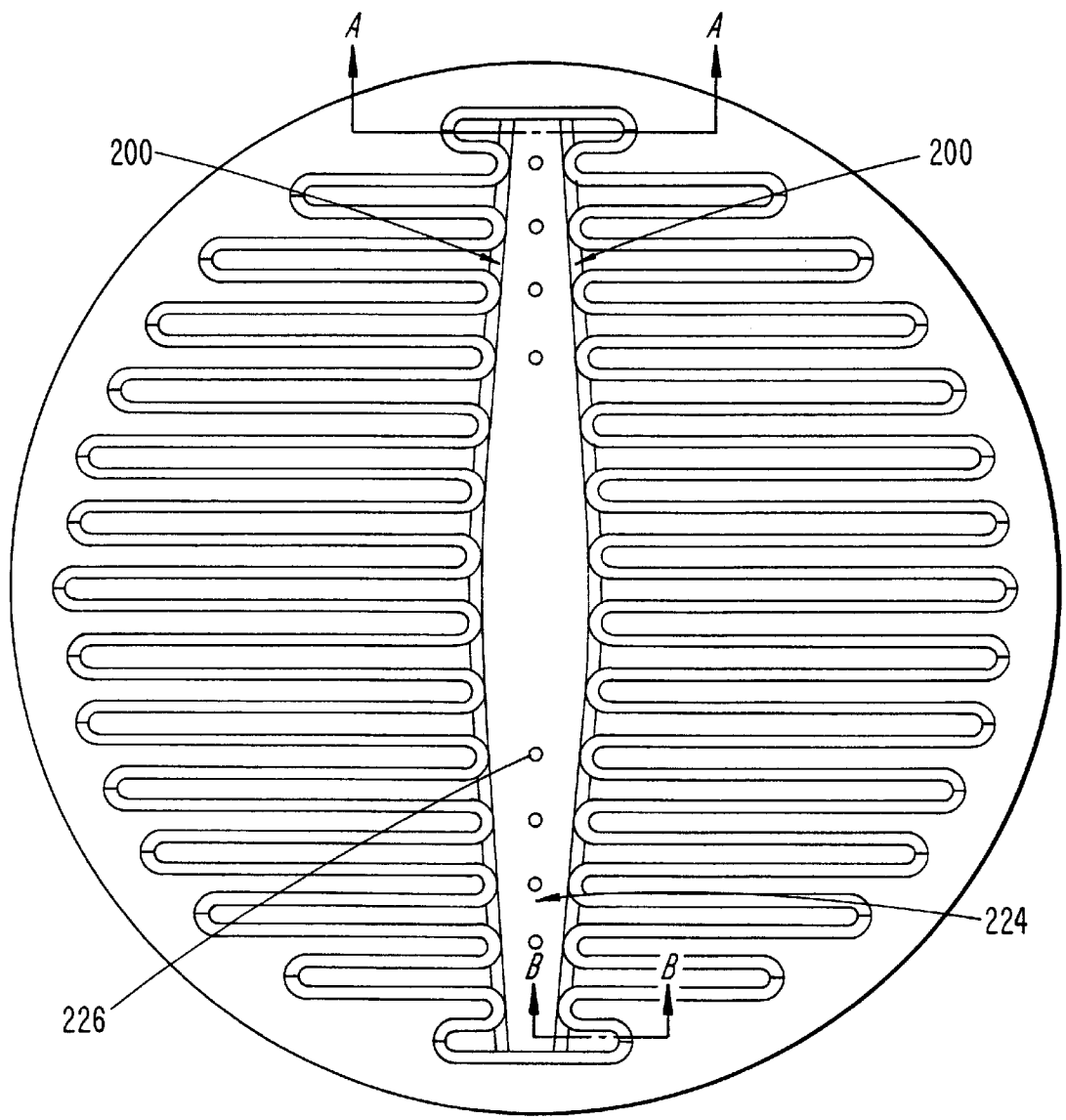
FIG. 21 illustrates a cathode/gate metalization pattern of a PPT according to another exemplary embodiment of the present invention.
Figure 22:
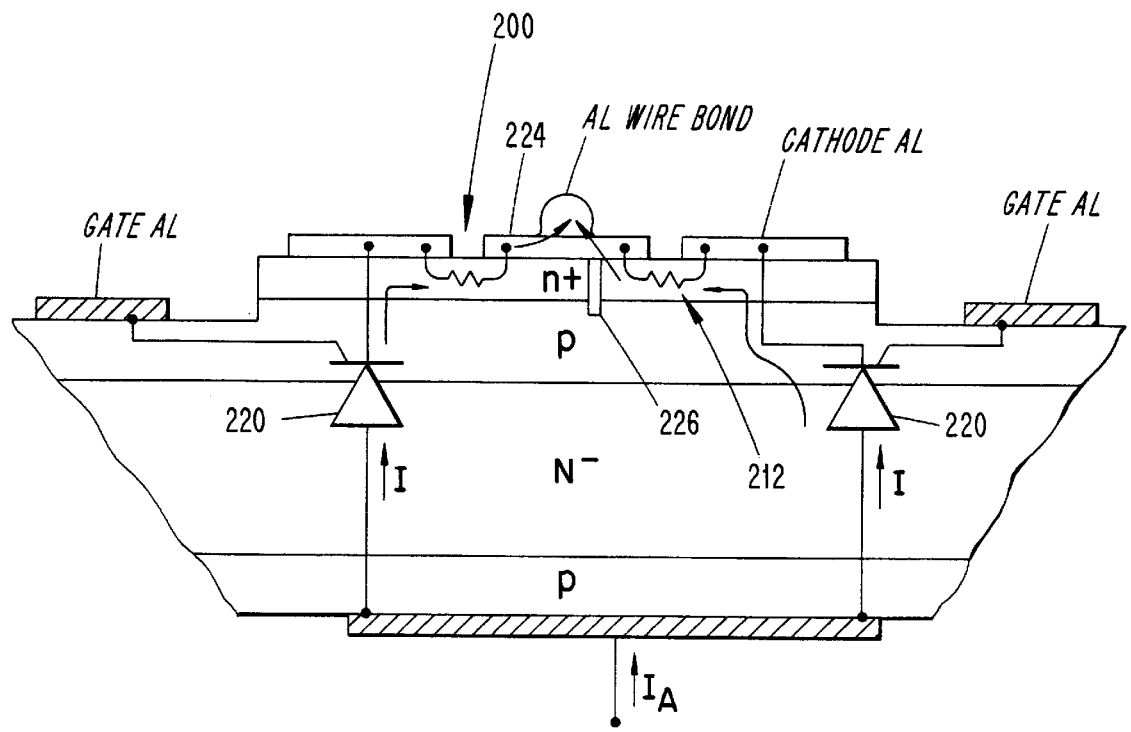
FIG. 22 is a cross-sectional view taken across line A—A of FIG. 21 in an equivalent circuit interpretation.
Figure 23:
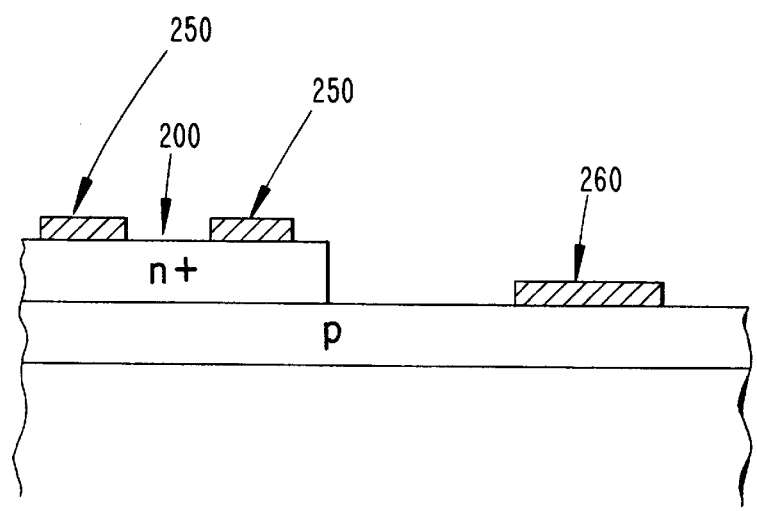
FIG. 23 is a cross-sectional view taken across line B—B of FIG. 21.

FIGS. 21–23 illustrate another exemplary embodiment of a PPT structure according to the present invention. FIG. 21 illustrates cuts or breaks 200, e.g., 1–3 mils, in the cathode metalization. These cuts or breaks 200 force cathode current into the underlying P-doped material. The resulting small, e.g., 0.002 ohm, ballast resistor created in each cathode "finger" tends to equalize cathode current preventing current "hogging" by a single finger or group of fingers.

FIG. 22 is a cross-sectional view taken along line A—A in FIG. 21, but in an equivalent circuit schematic interpretation. Note the cathode (emitter) ballast resistors 212 which cause the equivalent circuit to change from a single larger SCR (not shown) to several smaller finger SCRs 220 in parallel which each divide and share current equally. To ensure that finger SCRs 220 trigger first, the central cathode region 224 can be internally shorted 226 to reduce its gating sensitivity. The central region would then be turned on by the relatively slow plasma spreading from the finger areas. These shorts 226 would also be effective in improving temperature and di/dt performance. FIG. 23 is a cross-sectional view taken across lines B—B of FIG. 21 illustrating the breaks 200 in a particular finger.

Those skilled in the art will recognize that other embodiments of exciter circuitry according to the present invention flow from the foregoing exemplary embodiments. For example, instead of a single PPT switching device, several can be connected in series to provide greater blocking voltage capability. This in turn allows the usage of a higher tank voltage, e.g., about 15 kV, which means that the bulky and expensive output transformer of conventional exciter circuits can be replaced with a much smaller and cheaper output conductor. Since the PPT does not require the multitude of passive, back-biasing components needed with each of the series connected semiconductor devices in conventional circuits, this embodiment can be constructed relatively cheaply.

Engine exciter circuitry according to the foregoing exemplary embodiments and other embodiments not discussed herein provide many advantages over conventional exciter technology. The use of a novel semiconductor switching device, the PPT, having high di/dt characteristics (e.g., 200–1000 amperes/microsecond or higher as compared with conventional devices which provide about 100–150 amperes/microsecond) and high voltage blocking capabilities (e.g., greater than 2 kV) in a relatively small physical package (e.g., having an area about 1.5 inches×1.75 inches or smaller) provides numerous advantages for overall circuit design, operation and cost, some of which have been described above. Another advantage is the longer lifetime of circuits according to the present invention. Whereas conventional exciter circuits have a lifetime expectancy of, for example, about one million shots, circuits according to the present invention are expected to have a lifetime of about, for example, sixty million shots.

The above-described exemplary embodiments are intended to be illustrative in all respects, rather than restrictive, of the present invention. While it is apparent from the foregoing discussion that the output parameters of PPT devices according to the present invention can vary based on various design considerations, exemplary output parameters include:

0.5" diameter die, $I_{RMS}$=70A, $I_{PK}$=700A, di/dt=1000 A/$\mu$s 0.3" diameter die, $I_{RMS}$=25A, $I_{PK}$=250A, di/dt=500 A/$\mu$s Thus the present invention is capable of many variations in detailed implementation that can be derived from the description contained herein by a person skilled in the art. All such variations and modifications are considered to be within the scope and spirit of the present invention as defined by the following claims.

What is claimed is:

1. An exciter circuit comprising:

a node for receiving an input voltage;

a voltage conversion device for stepping up the input voltage;

an energy storage device for storing the stepped-up input voltage; and a semiconductor switching device for outputting the stored voltage to a pulse-forming network;

wherein said pulse forming network comprises a pulse capacitor and a transformer, said pulse capacitor connected to said voltage conversion device so that said pulse capacitor is charged at substantially the same time as said energy storage device.

2. The exciter circuit of claim 1, wherein said pulse capacitor is connected to said voltage conversion device so that voltage ringback stress on said pulse capacitor is reduced.

3. The exciter circuit of claim 1, wherein said semiconductor switching device has a di/dt characteristic of at least 1000 amperes per microsecond.

4. The exciter circuit of claim 1, wherein said semiconductor switching device has a di/dt characteristic of at least 500 amperes per microsecond.

5. The exciter circuit of claim 1, wherein said semiconductor switching device has a di/dt characteristic of at least 200 amperes per microsecond.

6. The exciter circuit of claim 5, wherein said semiconductor switching device comprises a single device capable of blocking at least 2 kV.

7. The exciter circuit of claim 5, wherein said semiconductor switching device comprises a single device capable of blocking at least 3–3.5 kV.

8. The exciter circuit of claim 1, wherein said transformer has a primary winding with an inductance of less than 20 microhenrys and said energy storage device stores at least 2 kV.

9. The exciter circuit of claim 8, wherein said transformer has a core volume of less than 1.5 cubic inches.

10. An exciter circuit comprising:

a node for receiving an input voltage;

a voltage conversion device for stepping up the input voltage to at least 2 kV;

an energy storage device for storing the stepped-up input voltage; and a semiconductor switching device for outputting the stored voltage to a pulse-forming network;

wherein said pulse forming network comprises a pulse capacitor and a transformer, said transformer having a primary winding inductance of less than 25 microhenrys.

11. The exciter circuit of claim 10, wherein said semiconductor switching device has a di/dt characteristic of at least 1000 amperes per microsecond.

12. The exciter circuit of claim 10, wherein said semiconductor switching device has a di/dt characteristic of at least 500 amperes per microsecond.

13. The exciter circuit of claim 10, wherein said semiconductor switching device has a di/dt characteristic of at least 200 amperes per microsecond.

14. The exciter circuit of claim 13, wherein said semiconductor switching device comprises a single device capable of blocking at least 2 kV.

15. The exciter circuit of claim 13, wherein said semiconductor switching device comprises a single device capable of blocking at least 3–3.5 kV.

16. The exciter circuit of claim 10, wherein said transformer has a core volume of less than 1.5 cubic inches.

17. An exciter circuit comprising:

a node for receiving an input voltage;

a voltage conversion device for stepping up the input voltage;

an energy storage device for storing the stepped-up input voltage;

a switching device for outputting the stored, stepped-up input voltage to an output network, said switching device having a di/dt characteristic of at least 200 amperes per microsecond; and wherein said output network comprises a pulse capacitor and a transformer wherein said transformer has a primary winding inductance of less than 20 microhenrys.

18. The exciter circuit of claim 1, wherein said pulse capacitor is interposed between a primary winding of said transformer and said voltage conversion device.

19. An exciter circuit comprising:

a node for receiving an input voltage;

a voltage conversion device for stepping up the input voltage;

an energy storage device for storing the stepped-up input voltage;

a semiconductor switching device for outputting the stored, stepped-up input voltage to an output network, and wherein said output network comprises a peaking network including an air core inductor and a capacitor.

20. The exciter circuit of claim 19, wherein said semiconductor switching device has a di/dt characteristic of at least 200 amperes per microsecond.

21. The exciter circuit of claim 19, wherein said output network consists essentially of said air core inductor and said capacitor.

* * * * *